(12) United States Patent
Sato et al.

(10) Patent No.: US 7,706,756 B2
(45) Date of Patent: Apr. 27, 2010

(54) RF POWER MODULE

(75) Inventors: Yusuke Sato, Tokyo (JP); Nobuyoshi Maejima, Tokyo (JP); Tomoaki Kudaishi, Tokyo (JP); Shinji Moriyama, Tokyo (JP); Naoki Kuroda, Tokyo (JP); Ryota Sato, Tokyo (JP); Masashi Okano, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 604 days.

(21) Appl. No.: 11/626,485

(22) Filed: Jan. 24, 2007

(65) Prior Publication Data

US 2007/0210866 A1 Sep. 13, 2007

(30) Foreign Application Priority Data

Feb. 28, 2006 (JP) ............................. 2006-052099

(51) Int. Cl.
*H04B 1/44* (2006.01)
*H04Q 7/20* (2006.01)

(52) U.S. Cl. ..................... 455/78; 455/127.4; 333/100

(58) Field of Classification Search .................. 455/78, 455/83, 127.4; 333/100–101, 124
See application file for complete search history.

(56) References Cited

U.S. PATENT DOCUMENTS 6,492,872 B1 * 12/2002 Fujioka et al. .............. 330/285

2006/0121874 A1 * 6/2006 Block et al. ................. 455/333

FOREIGN PATENT DOCUMENTS

| JP | 2003-249868 | 9/2003 |
|----|-------------|--------|
| JP | 2004-128288 | 4/2004 |
| JP | 2004-296627 | 10/2004 |
| JP | 2005-39320 | 2/2005 |

* cited by examiner

*Primary Examiner*—Lee Nguyen
(74) *Attorney, Agent, or Firm*—Mattingly & Malur, P.C.

(57) ABSTRACT

A technique is provided for achieving reduction in size of an electronic device with a power amplifier circuit, while enhancing the performance of the electronic device. An RF power module for a mobile communication device includes first and second semiconductor chips, a passive component, and first and second integrated passive components, which are mounted over a wiring board. In the first semiconductor chip, MISFET elements constituting power amplifier circuits for the GSM 900 and for the DCS 1800 are formed, and a control circuit is also formed. In the first integrated passive component, a low pass filter circuit for the GSM 900 is formed, and in the second integrated passive component, a low pass filter circuit for the DCS 1800 is formed. In the second semiconductor chip, antenna switch circuits for the GSM 900 and DCS 1800 are formed. Over the upper surface of the wiring board, the second semiconductor chip is disposed next to the first semiconductor chip between the integrated passive components.

14 Claims, 27 Drawing Sheets

RF POWER MODULE

CROSS-REFERENCE TO RELATED APPLICATION

The present application claims priority from Japanese patent application No. 2006-52099 filed on Feb. 28, 2006, the content of which is hereby incorporated by reference into this application.

BACKGROUND OF THE INVENTION

The present invention relates to an electronic device, and more particularly, to a technique suitable for use in an electronic device mounted on a mobile communication device.

In recent years, mobile communication devices (for example, cellular phones), which employ a communication system typified by GSM (Global System for Mobile Communications), PCS (Personal Communication System), PDC (Personal Digital Cellular), or CDMA (Code Division Multiple-Access) system, have gained widespread use throughout the world.

In general, such mobile communication devices are each composed of an antenna for emitting and receiving electric waves, a high-frequency power amplifier (power amplification module) for amplifying power-modulated high-frequency signals to supply them to the antenna, a receiver for processing the high-frequency signals received by the antenna, a controller for controlling the above-mentioned elements, and a cell (battery) for supplying a power supply voltage to these elements.

Japanese Unexamined Patent Publication No. 2005-39320 discloses a technique for a semiconductor element including a semiconductor substrate, and transistors formed on the semiconductor substrate for constituting a first-stage amplifier of a first amplification system and a next-stage amplifier of a second amplification system. At a partial area of the semiconductor substrate, there are provided first, second and third transistors constituting the first-stage amplifier of the first amplification system and the next-stage amplifier of the second amplification system, and a switch element for selecting predetermined two of the aforesaid three transistors according to a switching signal input. The switching by the switch element leads to formation of the first-stage amplifier of the first amplification system by means of the second and third transistors, or formation of the next-stage amplifier of the second amplification system by means of the first and second transistors.

Japanese Unexamined Patent Publication No. 2004-128288 discloses a technique which comprises a module substrate with front and back surfaces, and having a cavity part formed on the back surface, a control chip mounted on the front surface of the module substrate, chip components adjacent to the control chip and mounted on the front surface, an output chip disposed within the cavity part on the back surface of the module substrate, a plurality of lands disposed on the back surface of the module substrate, and a seal part for sealing the control chip and the plurality of chip components. A first GND pattern electrically connected to a GND potential is provided on the module substrate for strengthening an electromagnetic shield between the control chip on the front surface and the output chip on the back surface.

Japanese Unexamined Patent Publication No. 2004-296627 discloses a technique in which a source electrode on the back surface of a semiconductor chip with a n-channel LDMOS for amplification formed therein is coupled with a wiring pattern on a main surface of a wiring board. Also, the source electrode is connected electrically and thermally to a wiring pattern for supply of a reference potential on the back surface of the wiring board through a via hole extending from the main surface of the wiring board to the back surface thereof. Furthermore, a drain electrode on the back surface of a semiconductor chip with a PMOS of a trench gate structure formed therein adapted for supplying a power source voltage to the described n-channel LDMOS is coupled with a wiring pattern on the main surface of the wiring board. Also, the drain electrode is connected electrically and thermally to a via hole extending from the main surface of the wiring board to a position at the midpoint of the thickness of the wiring board. Under the via hole, another via hole is provided with an insulating plate sandwiched therebetween.

Japanese Unexamined Patent Publication No. 2003-249868 discloses a technique which comprises chip components including circuit parts having a filter function (a diplexer, and a LPF) laminated on the inner layer of a ceramic multilayer substrate among circuit parts constituting a front end, and a resin multilayer substrate having passive parts laminated on the inner layer thereof among circuit parts having a switch function (RF Switches). The chip components made of the ceramic multilayer substrate, and an active element constituting the switch are integrally mounted on the surface of the resin multilayer substrate. In addition, the chip components made of the ceramic multilayer substrate are mounted in such a state that input/output impedance of each chip component is compatible with the remaining other circuit parts of the front end.

SUMMARY OF THE INVENTION

The inventors have found the following results through study.

In the known mobile communication devices, a high-frequency signal for transmission is amplified by a power amplifier circuit to be supplied to an antenna. Thus, it is necessary to provide a low pass filter circuit for attenuating a harmonic component, and an antenna switch circuit for switching between transmission and reception between the power amplifier circuit and the antenna. The antenna switch circuit causes the high-frequency signal amplified by the power amplifier circuit to be transmitted from the antenna in transmission. Also, the antenna switch circuit causes a signal received from the antenna to be fed to another circuit in reception.

In order to amplify the high-frequency signal for transmission, a module for antenna switch including the low pass filter circuit and the antenna switch circuit is required between the antenna and a power amplification module including the power amplifier circuit.

However, providing the antenna switch module between the power amplification module and the antenna may result in an increase in size of the mobile communication device as a whole, leading to an increase in manufacturing cost. For this reason, the antenna switch circuit is proposed to be incorporated into the power amplification module. This can scale down the size of the entire mobile communication device.

Various problems, however, may be raised even when the power amplification module also serves simply as the antenna switch module.

For example, when a HBT (Heterojunction Bipolar Transistor) element is used in the power amplifier circuit of the power amplification module, there is a need for a semiconductor chip with the HBT element for power amplification formed thereon, another semiconductor chip with a control circuit or the like formed thereon, and a further semiconductor chip with an antenna switch circuit formed thereon. Thus, the number of semiconductor chips required is increased, which results in an increase in size of mounting areas of the semiconductor chips and of wire bonding regions, and thus in dimension of the power amplification module.

The high-frequency signal amplified by the power amplifier circuit is input into the antenna switch circuit via the low pass filter circuit. But, when these circuits are incorporated into one power amplification module, without various measures for arrangement of each circuit, the loss of the high-frequency signal may become large from the time when it is amplified by the power amplifier circuit to the time when it is input into the antenna switch circuit via the low pass filter circuit. This could reduce power addition effect of the power amplification module, leading to degraded performance. In particular, when there are provided two systems for GSM 900 and DCS 1800, each including the power amplifier circuit, the low pass filter circuit, and the antenna switch circuit, the power addition effect tends to be reduced depending on the arrangement of each circuit in either the GSM-900 system or the DCS-1800 system.

When noise is input into the semiconductor chip with the power amplifier circuit formed thereon, the power amplifier circuit can oscillate, which may result in degraded performance of the power amplification module.

Since the power amplification module mounts various components on the wiring board, if the low pass filter circuit and the antenna switch circuit are incorporated into the power amplification module, the number of components mounted will be increased. Thus, if the mounting reliability of various components is not enhanced, the reliability of the power amplification module can be reduced.

It is therefore an object of the invention to provide a technique that permits reduction in size of an electronic device.

It is another object of the invention to provide a technique that can enhance the performance of the electronic device.

The above-mentioned and other objects, and novel features of the present invention will be more apparent from the following detailed descriptions with reference to the accompanying drawings.

The outline of typical embodiments of the invention disclosed in the present application will be briefly described below.

According to one aspect of the invention, an electronic device includes a power amplifier circuit and a switch circuit to which an output of the power amplifier circuit is connected. The electronic device comprises a wiring board, a first semiconductor chip mounted over a main surface of the wiring board and including a MISFET formed therein for constituting the power amplifier circuit, and a second semiconductor chip mounted over the main surface of the wiring board for constituting the switch circuit.

According to another aspect of the invention, an electronic device includes a power amplifier circuit and a low pass filter circuit electrically connected to the power amplifier circuit. The electronic device comprises a wiring board, a first semiconductor chip mounted over a main surface of the wiring board for constituting the power amplifier circuit, and an integrated passive element mounted over the main surface of the wiring board for constituting the lowpass filter circuit. A pattern for identifying a position of the integrated passive element is formed over the main surface of the wiring board.

The effects obtained by the typical embodiments of the invention disclosed herein will be briefly described below.

The electronic device can be reduced in size.

Furthermore, the electronic device can have enhanced performance.

BRIEF DESCRIPTION OF THE DRAWINGS

FIG. 6 is an equivalent circuit diagram of the HEMT element of FIG. 5 when it is turned on;

DETAILED DESCRIPTION OF THE PREFERRED EMBODIMENTS

Figure 1:
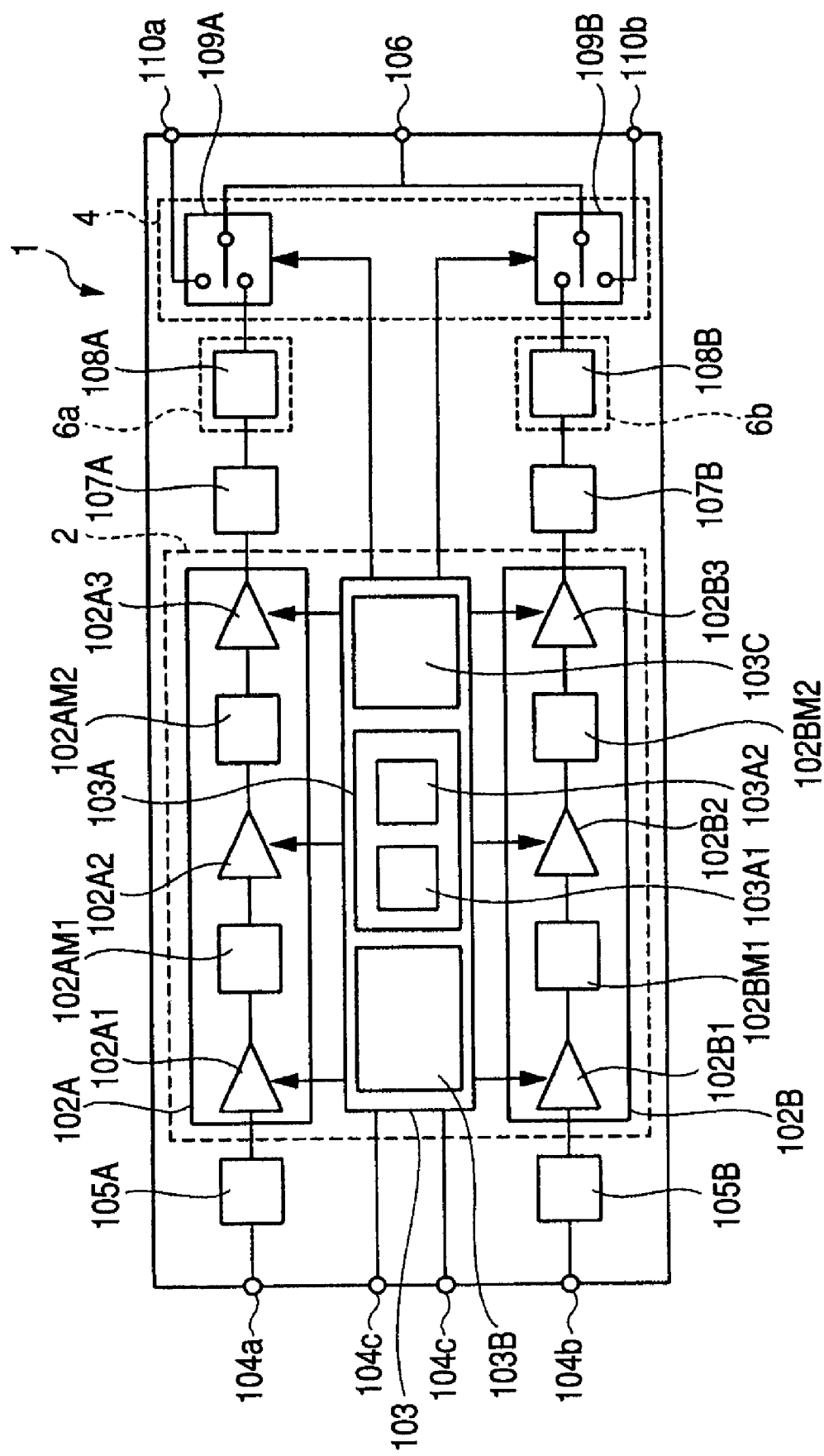
FIG. 1 is a circuit block diagram of amplifier circuits constituting an RF power module according to one embodiment of the invention.

The following embodiments will be described by being divided into a plurality of sections or embodiments if necessary for convenience. However, unless otherwise specified, they are not irrelevant to one another. One of the embodiments has to do with modifications, details and supplementary explanations of some or all parts of the other. When reference is made to the number of elements or the like (including the number of pieces, numerical values, quantity, range, etc.) in the following description of the embodiments, the number thereof is not limited to a specific number, and may be greater than, or less than, or equal to the specific number, unless otherwise specified and definitely limited to the specific number in principle. It is also needless to say that components (including elements or process steps, etc.) employed in the following description of the embodiments are not always essential, unless otherwise specified and considered to be definitely essential in principle. Similarly, when reference is made to the shapes, positional relations and the like of the components or the like in the following description of the embodiments, they will include ones substantially analogous or similar to their shapes or the like, unless otherwise specified and considered not to be definitely so in principle, etc. This is similarly applied even to the above-described numerical values and range.

Preferred embodiments of the invention will be described below in detail based on the accompanying drawings. Note that the same reference numbers will be used to refer to members having the same function throughout all the drawings for explanation of the embodiments, and thus the repeated description thereof will be omitted. In the following embodiments, the repeated description of the same or like parts will not be given in principle unless otherwise needed.

For better viewing of the accompanying drawing used in the embodiments, even in the sectional view, hatching may be omitted intentionally. In contrast, for better viewing of the plan view, hatching may be provided.

The preferred embodiments of the invention are directed to a power amplification module (electronic device), such as a RF (Radio Frequency) power module used in (or mounted on) a digital cellular phone (mobile communication device) for transmitting information using a network, such as a GSM system.

The term GSM (Global System for Mobile Communication) set forth herein means one of wireless communication systems or a specification thereof to be used in the digital cellular phone. The GSM has three frequency bands of the used electric wave, namely, 900 MHz band (824 to 915 MHz) which is called GSM 900 or simply GSM, 1800 MHz band (1710 to 1910 MHz) which is called GSM 1800 or DCS (Digital Cellular System) 1800 or PCN, and 1900 MHz band which is called GSM 1900, DCS 1900, or PCS (Personal Communication Services). Note that the GSM 1900 is used mainly in North America. Additionally, in North America, GSM 850 of 850 MHz band may be used in some cases. An RF power module (electronic device) 1 of the preferred embodiments of the invention is an RF power module (a high-frequency power amplifier, a power amplification module, a power amplifier module, a power amp module, a semiconductor device, or an electronic device) used at these frequency bands (at high frequency bands), for example.

FIG. 1 is a circuit block diagram of an amplifier circuit constituting the RF power module 1 of the embodiment (a high-frequency power amplifier, a power amplification module, a power amplifier module, a power amp module, a semiconductor device, or an electronic device). This figure shows the circuit block diagram (amplifier circuit) of the RF power module which can use two communication systems, namely, a GMSK (Gaussian filtered Minimum Shift Keying) modulation system, and an EDGE (Enhanced Data GSM Environment) modulation system, at each of the two frequency bands of the GSM 900 and the DCS 1800 (a dual-band type). The GMSK modulation system is a system used for communication of audio signals which is adapted to phase-shift the phase of carrier waves according to transmission data. The EDGE modulation system is a system used for data communication which is adapted to perform an amplitude shift operation in addition to the phase shift of the GMSK modulation.

As shown in FIG. 1, the circuit structure of the RF power module 1 has a power amplifier circuit for the GSM 900 (high-frequency power amplifier circuit) 102A including three amplification stages 102A1, 102A2, and 102A3, a power amplifier circuit for the DCS 1800 (high-frequency power amplifier circuit) 102B including three amplification stages 102B1, 102B2, and 102B3, a peripheral circuit 103, matching circuits 105A, 105B, 107A, and 107B, lowpass filters (low pass filter circuits) 108A and 108B, and switch circuits (a switching circuit, and an antenna switch circuit) 109A and 109B.

The matching circuit (input matching circuit) 105A is disposed between an input terminal 104a for the GSM 900 and the power amplifier circuit 102A (first amplification stage 102A1). The matching circuit (input matching circuit) 105B is disposed between an input terminal 104b for the DCS 1800 and the power amplifier circuit 102B (first amplification stage 102B1). The matching circuit (output matching circuit) 107A is disposed between the switch circuit 109A for the GSM 900 and the power amplifier circuit 102A (third amplification stage 102A3). The matching circuit (output matching circuit) 107B is disposed between the switch circuit 109B for DCS 1800 and the power amplifier circuit 102B (third amplification stage 102B3).

The lowpass filter 108A for the GSM 900 is disposed between the matching circuit 107A and the switch circuit 109A for the GSM 900, and an output of the power amplifier circuit 102A is input to the filter 108A via the matching circuit 107A. The low pass filter 108B for the DCS 1800 is disposed between the matching circuit 107B and the switch circuit 109B for the DCS 1800, and an output of the power amplifier circuit 102B is input to the filter 108B via the matching circuit 107B.

A matching circuit for stages (interstage matching circuit) 102AM1 is provided between the amplification stages 102A1 and 102A2 of the power amplifier circuit 102A for the GSM 900, and a matching circuit for stages (interstage matching circuit) 102AM2 is provided between the amplification stages 102A2 and 102A3. A matching circuit for stages (interstage matching circuit) 102BM1 is provided between the amplification stages 102B1 and 102B2 of the power amplifier circuit 102B for the DCS 1800, and a matching circuit for stages (interstage matching circuit) 102BM2 is provided between the amplification stages 102B2 and 102B3.

Among the above-mentioned components, the power amplifier circuit 102A (amplification stages 102A1-102A3) for the GSM 900, the power amplifier circuit 102B (amplification stages 102B1-102B3) for the DCS 1800, and the peripheral circuit 103 are formed in one semiconductor chip (a semiconductor amplification element chip, a power amplification element chip for high frequency, a semiconductor device, or an electronic device) 2.

The peripheral circuit 103 is a circuit for controlling and assisting amplification operations of the power amplifier circuits 102A and 102B, or for controlling the switch circuits 109A and 109B, and includes control circuits 103A, 103C, and a bias circuit 103B for applying bias voltages to the aforementioned amplification stages 102A1 to 102A3, and 102B1 to 102B3.

The control circuit 103A is a circuit for generating a predetermined voltage to be applied to the aforementioned power amplifier circuits 102A and 102B, and includes a power source control circuit 103A1 and a bias voltage generation circuit 103A2. The power source control circuit 103A1 is a circuit for generating a first power source voltage to be applied to a drain terminal of an amplification element (for example, MISFET) for output of each of the amplification stages 102A1-102A3, and 102B1-102B3. Further, the bias voltage generation circuit 103A2 is a circuit for generating a first control voltage for controlling the bias circuit 103B. Here, if the power source control circuit 103A1 generates the first power source voltage based on an output level designation signal supplied from an external baseband circuit, the bias voltage generation circuit 103A2 is adapted to generate the first control voltage based on the first power source voltage generated by the power source control circuit 103A1. The baseband circuit is a circuit for generating the aforementioned output level designation signal. The output level designation signal is a signal designating the output level of each of the power amplifier circuits 102A, 102B and is generated based on the output level corresponding to the distance between the cellular phone and the base station, that is, to the intensity of electric waves.

A control circuit 103C is a circuit for controlling the switch circuits 109A and 109B (a control circuit for the switch circuits 119A and 109B). The switch circuit 109A for the GSM 900 can serve to switch a terminal 106 to connect either to an output side of the low pass filter 108A for the GSM 900 or to a terminal 110a, in response to a control signal (switch signal) from the control circuit 103C. Similarly, the switch circuit 109B for the DCS 1800 can serve to switch the terminal 106 to connect either to an output side of the low pass filter 108B for the DCS 1800 or to a terminal 110b, in response to a control signal (switch signal) from the control circuit 103C.

An RF input signal inputted into an input terminal 104a for the GSM 900 of the RF power module 1 is inputted into the semiconductor chip 2 via the matching circuit 105A, and amplified by the power amplifier circuit 102A within the semiconductor chip 2, namely, the three amplification stages 102A1 to 102A3 to be output from the semiconductor chip 2 as the amplified RF signal (RF signal of the GSM 900). The amplified RF signal (RF signal of the GSM 900) output from the semiconductor chip 2 is inputted into the switch circuit 109A for the GSM 900 via the matching circuit 107A and the low pass filter 108A. When the switch circuit 109A switches the terminal 106 to connect it to the output side of the low pass filter 108A, the RF signal inputted into the switch circuit 109A via the low pass filter 108A (RF signal of the GSM 900) is output from the terminal 106 as an RF output signal (RF output signal of the GSM 900).

The RF input signal inputted into the input terminal 104b for the DCS 1800 of the RF power module 1 is inputted into the semiconductor chip 2 via the matching circuit 105B, and amplified by the power amplifier circuit 102B within the semiconductor chip 2, namely, the three amplification stages 102B1 to 102B3 to be output as the amplified RF signal (RF signal of the DCS 1800) from the semiconductor chip 2. The amplified RF signal (RF signal of the DCS 1800) output from the semiconductor chip 2 is inputted into the switch circuit 109B for the DCS 1800 via the matching circuit 107B and the low pass filter 108B. When the switch circuit 109B switches the terminal 106 to connect to the output side of the low pass filter 108B, the RF signal inputted into the switch circuit 109B via the low pass filter 108B (RF signal of the DCS 1800) is output from the terminal 106 as an RF output signal (RF output signal of the DCS 1800).

As will be described later, when the RF power module 1 is mounted on the mobile communication device, such as a cellular phone, the terminal 106 is electrically connected to the antenna for transmission and reception of the signals and electric waves. Thus, the RF output signal outputted from the terminal 106 of the RF power module 1 is transmitted from the antenna of the mobile communication device (cellular phone).

An input signal (for example, a control signal or the like) inputted into the input terminal 104c of the RF power module 1 is inputted to the peripheral circuit 103. Based on the input signal, the peripheral circuit 103 can control the power amplifier circuits 102A, 102B, and the switch circuits 109A, 109B.

Each matching circuit is a circuit for carrying out the impedance matching, and the low-pass filters 108A and 108B are the circuits for attenuating the harmonic components. Although the harmonic components (second harmonics and third harmonics) are caused by the power amplifier circuits 102A and 102B, the harmonic components included in the amplified RF signals are attenuated by the low pass filters 108A and 108B intervening between the power amplifier circuits 102A, 102B, and the switch circuits 109A, 109B, so that the harmonic component cannot be contained in the RF output signal from the terminal 106.

The low pass filter (bandpass filter) 108A for the GSM 900 located between the switch circuit 109A for the GSM 900 and the power amplifier circuit 102A for the GSM 900 can serve to pass signals in a frequency band of 824 to 915 MHz, and to cut off (or attenuate) frequencies in a double frequency band of the above-mentioned frequency band (for example, of 1648 to 1830 MHz) or in a triple frequency band thereof (for example, of 2472 to 2745 MHz) to avoid them from passing through the filter. The low pass filter (bandpass filter) 108B for the DCS 1800 located between the switch circuit 109B for the DCS 1800 and the power amplifier circuit 102B for the DCS 1800 can serve to pass signals in a frequency band of 1710 to 1910 MHz, and to cut off (or attenuate) frequencies in a double frequency band of the above-mentioned frequency band (for example, of 3420 to 3820 MHz) or in a triple frequency band thereof (for example, of 5130 to 5730 MHz) to avoid them from passing through. Accordingly, the low pass filters (low pass filter circuits) 108A and 108B can serve as a bandpass filter (bandpass filter circuit) which is designed to pass signals in a predetermined frequency band, while attenuating signals in other frequency bands.

The switch circuit 109A is a switch circuit for switching between transmission and reception of the GSM 900. In transmission of the signals in the GSM 900 band, the terminal 106 is electrically connected to the output side of the low pass filter 108A for the GSM 900 by the switch circuit 109A for the GSM 900, while in reception of the signals in the GSM 900 band, the terminal 106 is electrically connected to the terminal 110a for the GSM 900 by the switch circuit 109A for the GSM 900. The switch circuit 109B is a switch circuit for switching between transmission and reception of the DCS 1800. In transmission of the signals in the DCS 1800 band, the terminal 106 is electrically connected to the output side of the low pass filter 108B for the DCS 1800 by the switch circuit 109B for the DCS 1800, while in reception of the signals in the DCS 1800 band, the terminal 106 is electrically connected to the terminal 110b for the DCS 1800 by the switch circuit 109B for the DCS 1800.

As mentioned above, the RF power module 1 of the embodiment has the power amplifier circuits 102A and 102B of the two systems (that is, for the GSM 900 and for the DCS 1800), to which the low pass filters 108A and 108B, and the switch circuits 109A and 109B are respectively connected. The transmission frequency bands of the power amplifier circuits 102A and 102B in the two systems are 0.9 GHz band and 1.8 GHz, respectively. Thus, the RF power module 1 is a semiconductor device or an electronic device having the power amplifier circuits. The RF power module 1 has the switch circuits 109A and 109B to which the outputs of the power amplifier circuits 102A and 102B are connected via the matching circuits 107A, 107B, and the low pass filters 108A, 108B as described above. Also, the RF power module 1 is the semiconductor device or electronic device having the power amplifier circuit and the switch circuit to which the output of the power amplifier circuit is connected.

Figure 2:
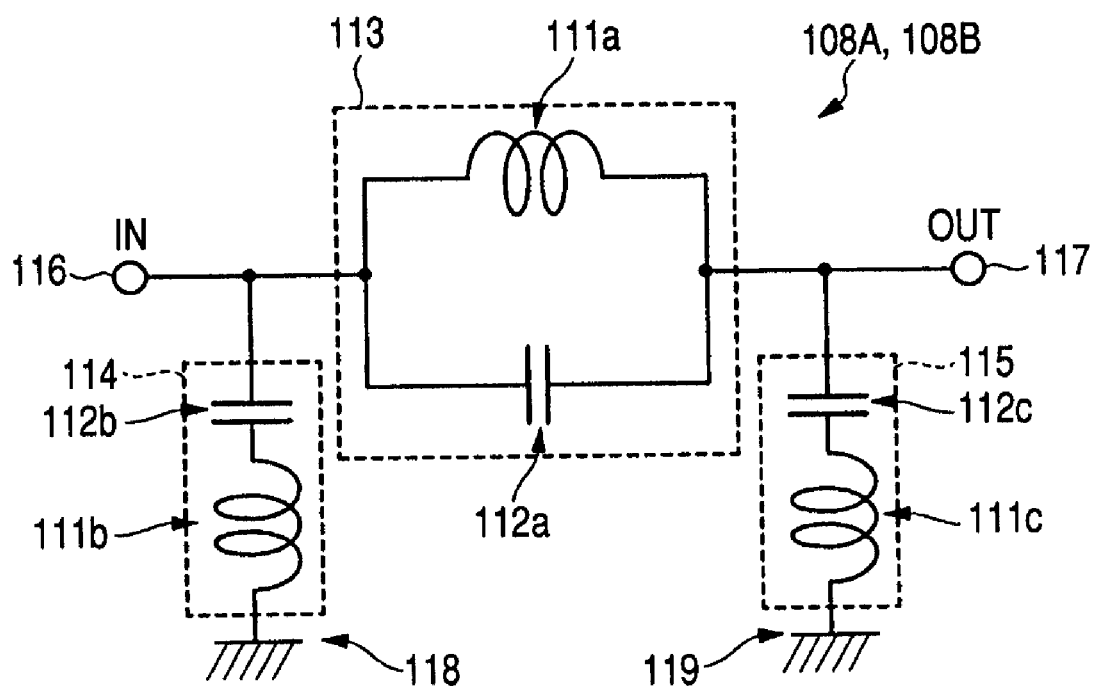
FIG. 2 is a circuit diagram showing an example of a circuit structure of a low pass filter.

FIG. 2 is a circuit diagram (equivalent circuit diagram) showing an example of a circuit structure of the low pass filters 108A and 108B. Each of the low pass filters 108A and 108B is composed of inductor elements 111a, 111b, 111c and capacitance elements 112a, 112b, 112c.

As shown in FIG. 2, each of the low pass filters 108A and 108B is composed of one parallel resonant circuit (a LC parallel resonant circuit, a parallel resonator) 113 and two series resonant circuits (LC series resonant circuits, series resonator) 114, 115. In the embodiment, a circuit with a parallel connection of the inductor element and the capacitance element is herein after referred to as a parallel resonant circuit (parallel resonator), and a circuit with a series connection of the inductor element and the capacitance element is hereinafter referred to as a series resonant circuit (series resonator). The RF signals amplified by the power amplifier circuits 102A and 102B are input into the input terminals 116 of the low pass filters 108A and 108B via the matching circuits 107A and 107B, and the harmonic components of the RF signals are attenuated to be output from the output terminals 117 of the low pass filters 108A and 108B.

The parallel resonant circuit 113 is composed of the inductor element 111a and the capacitance element 112a which are connected to each other in parallel between an input terminal 116 and an output terminal 117 of the low pass filter. The series resonant circuit 114 is composed of the inductor element 111b and the capacitance element 112b which are connected to each other in series between the input terminal 116 and the ground terminal 118 of the lowpass filter. The series resonant circuit 115 is composed of the inductor element 111c and the capacitance element 112c which are connected to each other in series between the output terminal 117 and the ground terminal 119 of the low pass filter. Thus, the inductor element 111a and the capacitance element 112a are connected to each other in parallel between the input terminal 116 and the output terminal 117, the inductor element 111b and the capacitance element 112b are connected to each other in series between the input terminal 116 and the ground terminal 118, and the inductor element 111c and the capacitance element 112c are connected to each other in series between the output terminal 117 and the ground terminal 119. In this way, each of the low pass filters 108A and 108B is formed.

Although the low pass filter 108A and the low pass filter 108B have the same circuit structure, the low pass filter 108A differs from the low pass filter 108B in inductance value of the inductor elements 111a, 111b, and 111c, and also in capacitance value of the capacitance elements 112a, 112b, and 112c. Taking into consideration the frequency bands passing through the low pass filters, and the frequency bands and attenuation factors of the frequencies attenuated by those filters, the inductance values of the inductor elements 111a, 111b, 111c of the low pass filter 108A, and the inductance values of the inductor elements 111a, 111b, 111c of the lowpass filter 108B can be set independently. Similarly, the capacitance values of the capacitor elements 112a, 112b, 112c of the low pass filter 108A, and the capacitance values of the capacitor elements 112a, 112b, 112c of the low pass filter 108B can be set independently.

In the embodiment, each of the low pass filters 108A and 108B is composed of an integrated passive device (IPD: Integrated Passive Device corresponding to an integrated passive component 5 as described later). Within the integrated passive device, the inductor elements 111a, 111b, 111c, and the capacitance elements 112a, 112b, 112c are formed thereby to form the low pass filter 108A or 108B.

Figure 3:
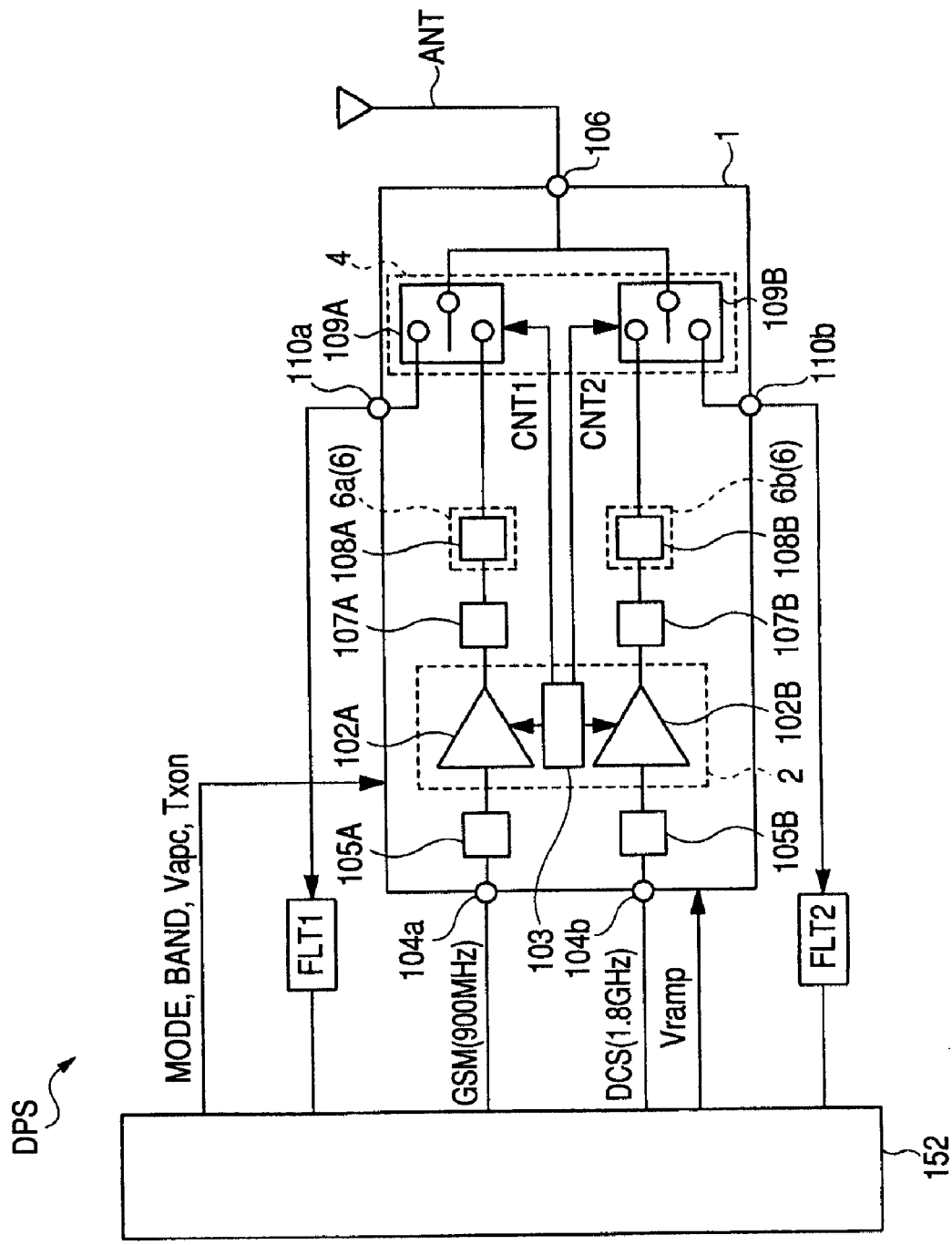
FIG. 3 is an explanatory diagram of an example of a digital cellular phone system using the RF power module of the embodiment of the invention.

FIG. 3 shows an example of a digital cellular phone system DPS (electronic device) using the RF power module 1 of the embodiment. Reference character ANT in FIG. 3 indicates an antenna for transmission and reception of signals and electric waves. Reference numeral 152 indicates a circuit part which includes a baseband circuit for converting an audio signal to a baseband signal, for converting a received signal to the audio signal, and for generating a modulation system switching signal and a band switching signal, and a modulation circuit for down-converting and decoding the received signal into the baseband signal and for modulating a transmission signal. The circuit part 152 is composed of a plurality of semiconductor integrated circuits which include a DSP (Digital Signal Processor), a microprocessor, a semiconductor memory, and the like. FLT1 and FLT2 are filters for removing interfering waves and noise from the received signal. The filter FLT1 is dedicated for the GSM, and the filter FLT2 for the DCS. Switching signals CNT1 and CNT2 for the switch circuits 109A and 109B of the RF power module 1 are supplied from the peripheral circuit 103 (the aforementioned control circuit 103C thereof) to the switch circuits 109A and 109B based on a control signal supplied from the circuit part 152 (baseband circuit thereof) to the peripheral circuit 103 (the aforementioned control circuit 103C thereof) of the RF power module 1.

As can be seen from FIG. 3, the outputs of the power amplifier circuits 102A and 102B are connected to the terminal 106 via the matching circuits 107A, 107B, the low pass filters 108A, 108B, and the switch circuits 109A, 109B. The terminal 106 of the RF power module 1 is connected to the antenna ANT. When the antenna ANT for transmission and reception is electrically connected to the RF signals amplified by the power amplifier circuits 102A and 102B, via the low pass filter circuits 108A and 108B by the switch circuits 109A and 109B (in transmission), the antenna ANT for transmission and reception serves as an antenna for transmission, which causes the RF signal for transmission to be transmitted from the RF power module 1 to the antenna ANT for transmission and reception. In reception, the antenna ANT for transmission and reception is connected to terminals 110a and 110b by the switch circuits 109A and 109B, and the received RF signal by the antenna are fed to the circuit part 152 via the filter FLT1 or FLT2.

Figure 4:
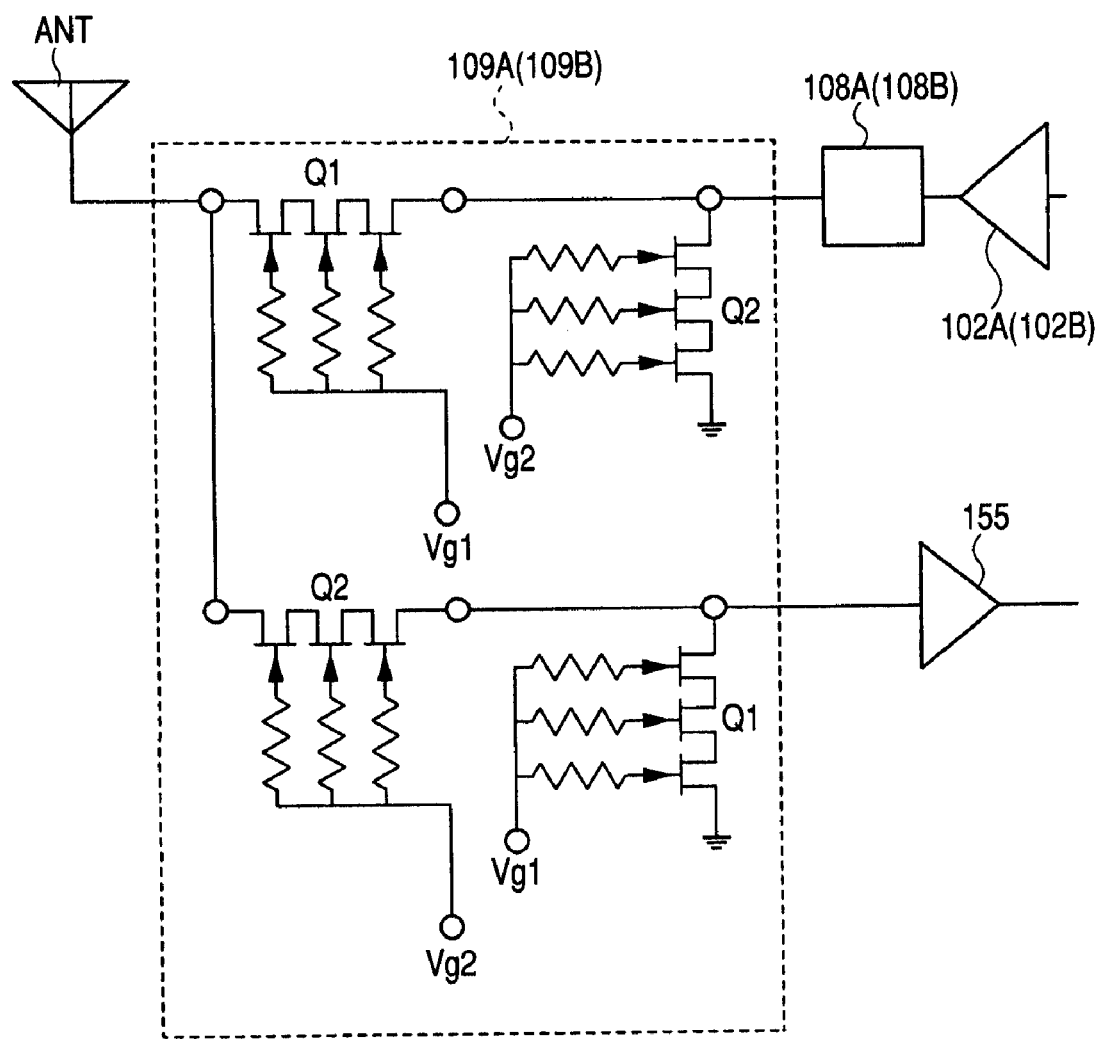
FIG. 4 is a circuit diagram showing an example of a circuit structure of a switch circuit.

FIG. 4 is a circuit diagram (a circuit diagram of a main part, or an equivalent circuit diagram) showing an example of a circuit structure of each of the switch circuit 109A and 109B. The switch circuit 109A for the GSM 900 and the switch circuit 109B for the DCS 1800 have the substantially same circuit structure, and respectively include the circuit structure shown in FIG. 4.

In the embodiment, as shown in FIG. 4, each of the switch circuits 109A and 109B can be formed of a HEMT (High Electron Mobility Transistor). That is, a switching element of each of the switch circuits 109A and 109B can be constituted of the HEMT. In a case shown in FIG. 4, each switch circuit 109A, 109B is formed of two HEMTQ1s and two HEMTQ2s. The HEMTQ1 and HEMTQ2 are not turned on simultaneously, but when one is turned on, the other is turned off.

That is, when a voltage Vg1 is applied to gates of the two HEMTQ1s (when the HEMTQ1s are turned on), no voltage is applied to gates of the two HEMTQ2s (the HEMTQ2s are turned off), and the transmission RF signal (transmission RF signal amplified by the power amplifier circuit 102A or 102B) is transmitted from the RF power module 1 to the antenna ANT for transmission and reception.

In contrast, when a voltage Vg2 is applied to the gates of the two HEMTQ2s (when the HEMTQ2s are turned on), no voltage is applied to the gates of the two HEMTQ1s (the HEMTQ1s are turned off) and a received RF signal is transmitted from the antenna ANT for transmission and reception to a LNA (Low Noise Amplifier) 155 for amplifying the received signal. Note that in FIG. 3, the LNA 155 is illustrated included in the circuit part 152.

Figure 5:
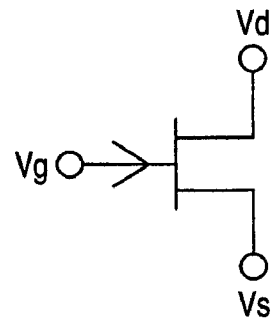
FIG. 5 is a circuit diagram of a HEMT element used in the switch circuit of FIG. 4.
Figure 6:
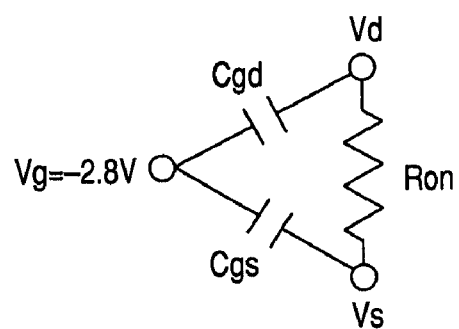
Figure 7:
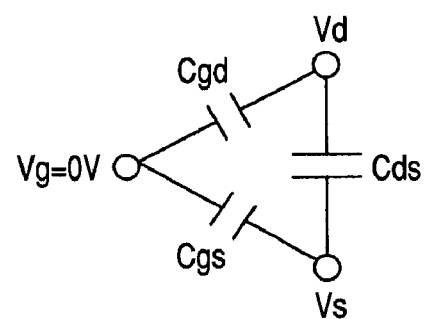
FIG. 7 is an equivalent circuit diagram of the HEMT element of FIG. 5 when it is turned off.

FIG. 5 shows a circuit diagram of the HEMTQ1 and HEMTQ2, FIG. 6 shows an equivalent circuit diagram when the HEMTQ1 and HEMTQ2 are turned on, and FIG. 7 shows an equivalent diagram when the HEMTQ1 and HEMTQ2 are turned off.

The circuit diagram of FIG. 5 can illustrate that in the HEMTQ1 and HEMTQ2, a drain bias Vd, a source bias Vs, and a gate bias Vg in a switching operation are all set to zero V, except that the gate bias Vg is set to −2.8 V when off. Under each bias condition as mentioned above, the HEMTQ1 and Q2 can be represented by the equivalent circuit diagram shown in FIG. 6 when on, and a capacitance Cgd, a capacitance Cgs, and an on resistance Ron are formed between the gate and a drain, between the gate and a source, and between the source and the drain of each of the HEMTQ1 and HEMTQ2, respectively. The HEMTQ1 and Q2 can be represented by the equivalent circuit diagram shown in FIG. 7 when off, and the capacitance Cgd, the capacitance Cgs, and a capacitance Cds are formed between the gate and the drain, between the gate and the source, and between the source and the drain of the HEMTQ1 and HEMTQ2, respectively.

Figure 8:
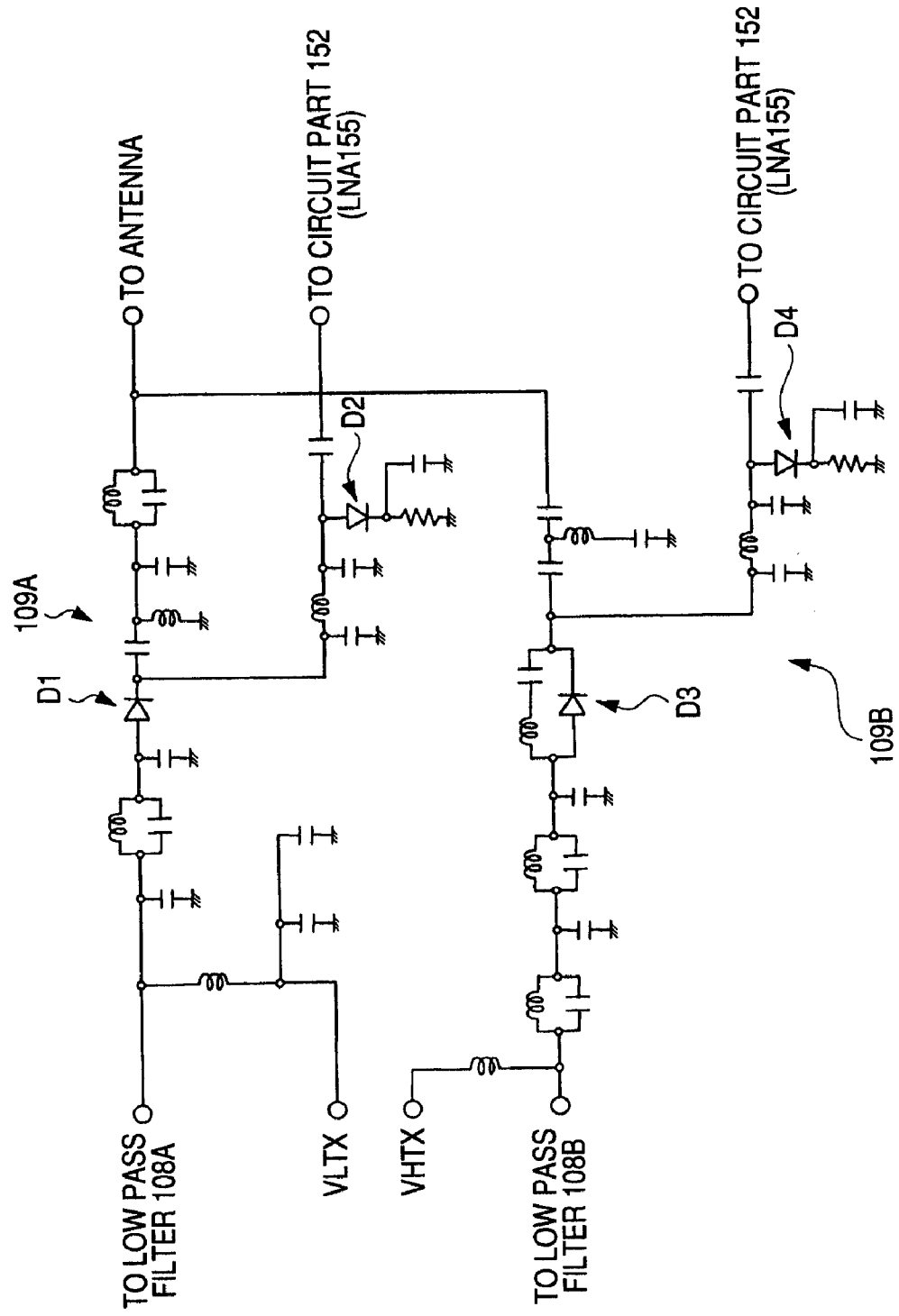
FIG. 8 is a circuit diagram showing an example of another circuit structure of the switch circuit.

FIG. 8 is a circuit diagram (a circuit diagram of a main part, or an equivalent circuit diagram) showing another example of the circuit structure of the switch circuits 109A and 109B. Although in FIG. 4, the switch circuits 109A and 109B are formed using the HMET elements or the like, the switch circuits 109A and 109B may be formed using diode elements D1, D2, D3, and D4, and the like as shown in FIG. 8. These diode elements D1, D2, D3, and D4 can be constituted of, for example, PIN (P-Intrinsic-N) diodes. It should be noted that in FIG. 8, when a voltage is applied to the VLTX, the antenna ANT and the lowpass filter 108A are connected to each other, but the antenna ANT and the circuit 152 are disconnected from each other. When the VLTX is at the GND (ground potential), the antenna ANT and the low pass filter 108A are disconnected from each other, and the antenna ANT and the circuit part 152 are connected to each other. The same goes for a VHTX.

The switch circuits 109A and 109B can be formed by the circuits using the HEMT elements shown in FIG. 4, or by the circuits using the diode elements shown in FIG. 8.

Now, the structure of the RF power module 1 according to embodiment will be described below.

Figure 9:
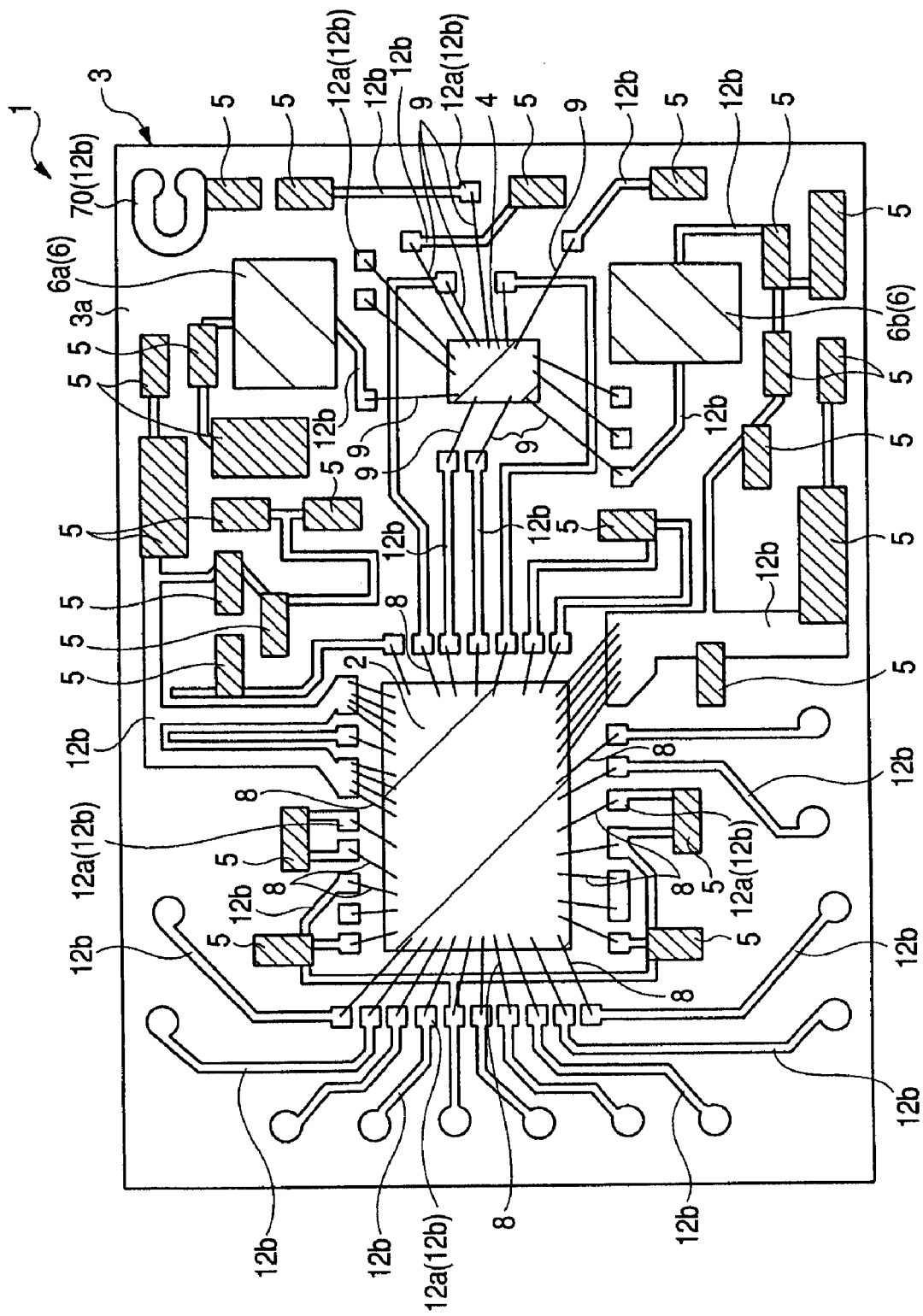
FIG. 9 is a top view showing a structure of the RF power module according to the embodiment.
Figure 10:
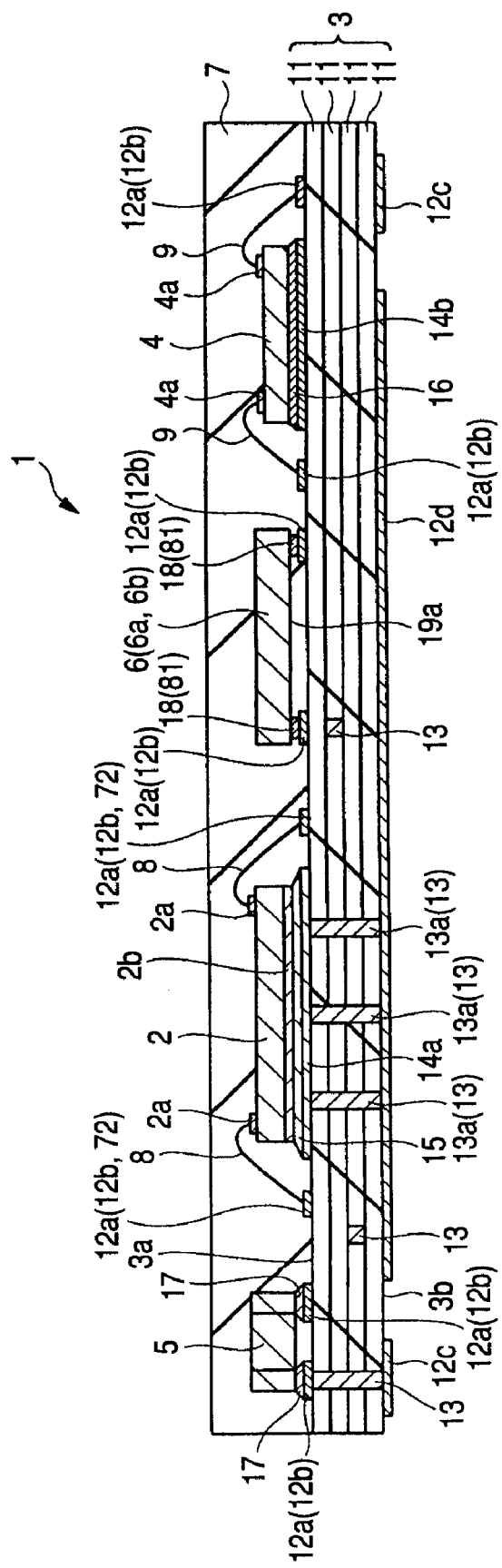
FIG. 10 is a sectional view of the RF power module according to the embodiment.

FIG. 9 is a conceptual top view (plan view) showing the structure of the RF power module 1 of the embodiment, and FIG. 10 is a conceptual sectional diagram of the RF power module 1 of the embodiment. FIG. 9 shows a state in which the RF power module is seen through a seal resin 7. Furthermore, FIG. 10 corresponds to a sectional view (side sectional view) of FIG. 9, showing the conceptual structure of the RF power module 1, and does not correspond completely to a section obtained by cutting the structure of FIG. 9 at a predetermined position. Although FIG. 9 is a plan view, hatching is applied to the semiconductor chips 2 and 4, the passive component 5, and an integrated passive component 6 for easy viewing.

The RF power module 1 of the embodiment shown in FIGS. 9 and 10 includes a wiring board 3, the semiconductor chips (a semiconductor element, and an active element) 2 and 4 mounted (implemented) over the wiring board 3, the passive component 5 mounted over the wiring board 3, the integrated passive components (the integrated passive element, the IPD, and the electronic device) 6 mounted on the wiring board 3, and the seal resin (a seal part and a seal resin part) 7 for covering the upper surface of the wiring board 3 including the semiconductor chips 2, 4, the passive component 5, and the integrated passive component 6. The semiconductor chips 2, 4, the passive component 5, and the integrated passive component 6 are electrically connected to a conductive layer (transmission line) of the wiring board 3. Furthermore, the RF power module 1 can be implemented on, for example, an external circuit board or a mother board not shown.

The wiring board (a multilayer board, a multilayer wiring board, or a module substrate) 3 is a multilayer board (a multilayer wiring board) including, for example, a plurality of insulating layers (dielectric layers) 11, and a plurality of conductive layers or wiring layers (not shown), which are laminated integrally. Although in FIG. 10, four insulating layers 11 are laminated to form the wiring board 3, the number of the laminated insulating layers 11 is not limited thereto, and various modifications to the number of insulating layers or the like can be made. Ceramic materials, such as alumina (aluminum oxide, Al2O3), can be used as the material for forming the insulating layer 11 of the wiring board 3. In this case, the wiring board 3 is a ceramic multilayer substrate. The material for the insulating layer 11 of the wiring board 3 is not limited to the ceramic material, and various modifications to the material can be made. For example, a glass epoxy resin can be used.

Conductive layers (wiring layers, wiring patterns, and conductive patterns) for forming the wiring are formed on the upper surface (front or main surface) 3a, and on the lower surface (the back or main surface) 3b of the wiring board 3, and between the insulating layers 11. A conductive pattern 12b (including a substrate side terminal 12a) made of an electric conductor is formed on the upper surface 3a of the wiring board 3 by the conductive layer positioned on the uppermost layer of the wiring board 3. An external connection terminal (a terminal, an electrode, or a module electrode) 12c made of an electric conductor is formed on the lower surface 3b of the wiring board 3 by the conductive layer positioned on the lowermost layer of the wiring board 3.

A substrate side terminal (a terminal, an electrode, a transmission line, or a wiring pattern) 12a is formed on the upper surface 3a of the wiring board 3 by a part of the conductive pattern 12b. The substrate side terminals 12a are parts of the conductive patterns 12b on the upper surface 3a of the wiring board 3 which parts are electrically connected to the electrodes 2a and 4a of the semiconductor chips 2 and 4 via bonding wires 8 and 9 (that is, parts in connection with the bonding wires 8 and 9), or parts of the conductive patterns 12b in connection with the passive component 5 or the electrode of the integrated passive component 6. The external connection terminals 12c correspond to, for example, the input terminals 104a, 104b, 104c, and the terminals 106, 110a, 110b shown in FIG. 1. Also inside the wiring board 3, that is, between the insulating layers 11, are formed the conductive layers (the wiring layers, the wiring patterns, and the conductive patterns), which are not illustrated in FIG. 10 for simplification. The wiring pattern for supply of a reference potential (for example, a terminal 12d for supply of a reference potential on the lower surface 3b of the wiring board 3) among the wiring patterns formed by the conductive layers of the wiring board 3 can be formed in a rectangular pattern so as to cover a large part of a wiring formation surface of the insulating layer 11. The wiring pattern for transmission line among the wiring patterns formed by the conductive layers can be formed in a strip pattern.

The respective conductive layers (wiring layers) included in the wiring board 3 are electrically connected to one another via conductors or conductive films within via holes (through holes) 13 formed in the insulating layers 11 if necessary. Thus, the substrate side terminals 12a on the upper surface 3a of the wiring board 3 are connected via the conductive pattern 12b on the upper surface 3a of the wiring board 3 and/or the wiring layers inside the wiring board 3 (wiring layers between the insulating layers 11), or via the conductive film within the via hole 13 if necessary. The substrate-side terminals are electrically connected to the external connection terminal 12c on the lower surface 3b of the wiring board 3, or to the terminal 12d for supply of the reference potential. Among the via holes 13, a via hole 13a provided under the semiconductor chip 2 can serve as a thermal via for transmitting heat caused in the semiconductor chip 2 or the like to the lower surface 3b side of the wiring board 3.

The semiconductor chip 2 has a semiconductor integrated circuit formed thereon, and corresponding to the circuit structure enclosed by a dotted line indicating the semiconductor chip 2 in the circuit block diagram of FIG. 1. Thus, in the semiconductor chip 2 (or in a front layer part), are formed semiconductor amplification elements, for example, MISFETs (Metal Insulator Semiconductor Field Effect Transistor) constituting the power amplifier circuits 102A and 102B (amplification stages 102A1 to 102A3, and 102B1 to 102B3 thereof), a semiconductor element constituting the peripheral circuit 103, and passive elements constituting the matching circuits (interstage matching circuits) 102AM1, 102AM2, 102BM1, and 102MB2 constituting the peripheral circuit 103. As described above, the RF power module (electronic device) 1 has the power amplifier circuits 102A and 102B, and the semiconductor chip 2 is an active element constituting the power amplifier circuits 102A and 102B. The semiconductor chip 2 is manufactured by the steps of forming the semiconductor integrated circuit on a semiconductor substrate (substrate wafer) which is made of, for example, single crystal silicon, grinding the back surface of the semiconductor substrate if necessary, and then separating the semiconductor substrate into the semiconductor chips 2 by dicing or the like.

Figure 11:
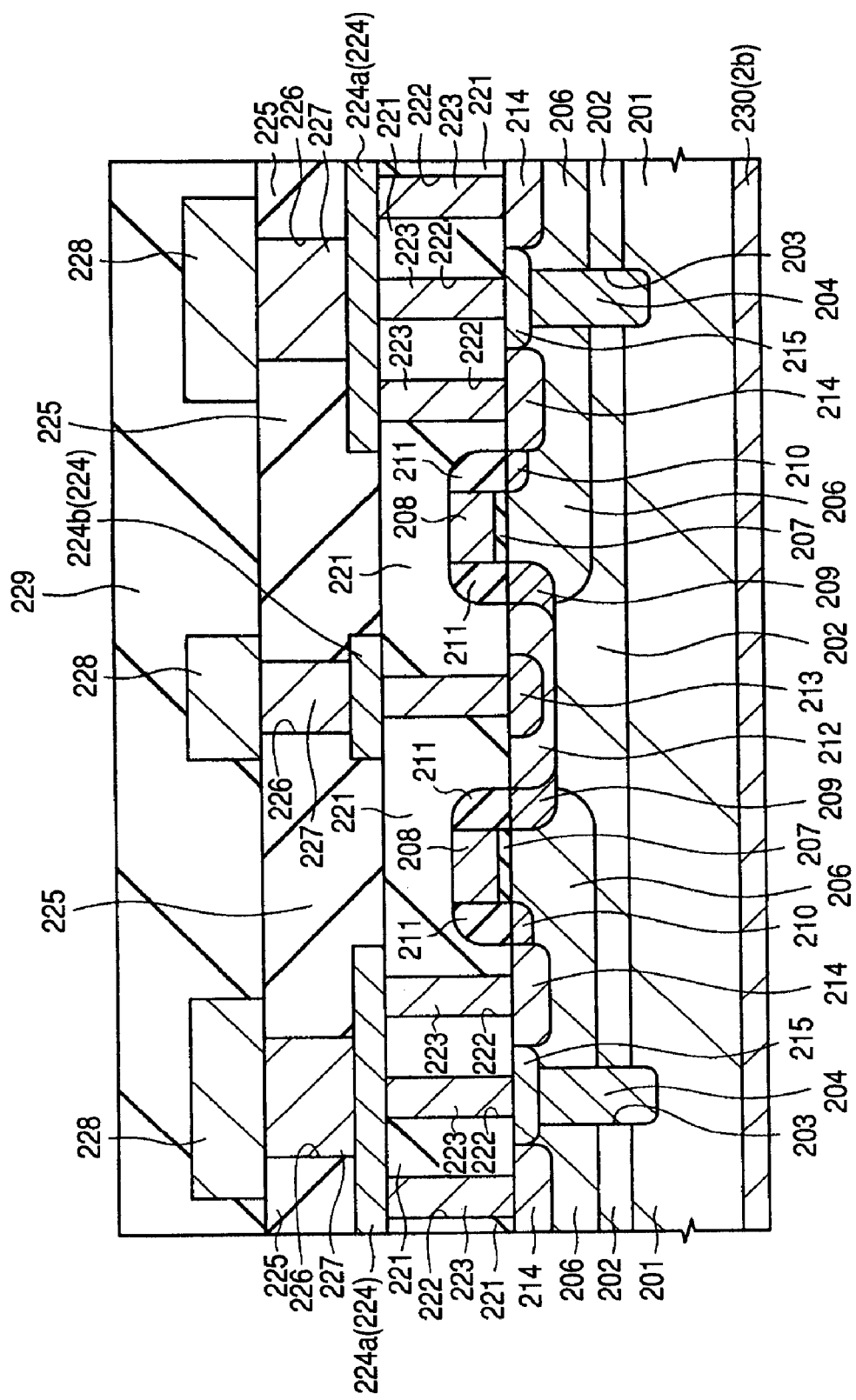
FIG. 11 is a sectional view of a main part of a semiconductor chip when a semiconductor amplification element is formed of a LDMOSFET.

FIG. 11 is a sectional view of a main part of an example of the semiconductor chip 2 when the semiconductor amplification element constituting each of the above-mentioned power amplifier circuits 102A and 102B (amplification stages 102A1 to 102A3, and 102B1 to 102B3) is formed of the MISFET element, such as a LDMOSFET (Laterally Diffused Metal-Oxide-Semiconductor Field Effect Transistor).

Referring to FIG. 11, an epitaxial layer 202 made of p$^-$-type single crystal silicon is formed on the main surface of a semiconductor substrate 201 made of p$^+$-type single crystal silicon. A p-type well 206 serving as a punch-through stopper is provided on a part of the main surface of the epitaxial layer 202 for preventing the extension of a depletion layer from the drain to the source of the LDMOSFET. A gate electrode 208 of the LDMOSFET is formed over the surface of the p-type well 206 via a gate insulating film 207 made of silicone oxide. The gate electrode 208 is formed of, for example, an n-type polycrystalline silicon film, or a laminated film of a n-type polycrystalline silicon film and a metal silicide film. The gate electrode 208 has side wall spacers 211 made of the silicon oxide or the like formed on the side walls thereof.

The source and drain of the LDMOSFET are formed in regions spaced apart from each other with a channel forming region sandwiched inside the epitaxial layer 202. The drain is composed of an n$^-$-type offset drain region 209 in contact with the channel forming region, an n-type offset drain region 212 in contact with the n$^-$-type offset drain region 209 and spaced apart from the channel forming region, and an n$^+$-type drain region 213 in contact with the n-type offset drain region 212 and further spaced a part from the channel forming region. Among the n$^-$-type offset drain region 209, the n-type offset drain region 212 and the n$^+$-type drain region 213, the n$^-$-type offset drain region 209 located nearest to the gate electrode 208 has the lowest impurity concentration, while the n$^+$-type drain region 213 spaced farthest from the gate electrode 208 has the highest impurity concentration.

The source of the LDMOSFET is composed of an n$^-$-type source region 210 in contact with the channel forming region, and an n$^+$-type source region 214 in contact with the n$^-$-type source region 210 and formed apart from the channel forming region. The n$^+$-type source region 214 has the impurity concentration higher than that of the n$^-$-type source region 210. A p-type halo region (not shown) can be formed under the n$^-$-type source region 210.

On one end of the n$^+$-type source region 214 (on an end opposite to the side in contact with the n$^-$-type source region 210), a p-type punch layer 204 is formed in contact with the n$^+$-type source region 214. A p$^+$-type semiconductor region 215 of the p-type punch layer 204 is formed near the surface of the layer 204. The p-type punch layer 204 is a conductive layer for electrically connecting the source of the LDMOS- FET with the semiconductor substrate 201, and is made of a p-type polycrystalline silicon film, which is formed, for example, by being embedded into a groove 203 formed in the epitaxial layer 202.

Plugs 223 in contact holes 222 formed in the insulating film (interlayer insulating film) 221 are respectively connected on to the p-type punch layer 204 ($p^+$-type semiconductor region 215), the source ($n^+$-type source region 214), and the drain ($n^+$-type drain region 213) of the LDMOSFET. A source electrode 224a (wiring 224) is connected to the p-type punch layer 204 ($p^+$-type semiconductor region 215) and the source ($n^+$-type source region 214) via the plug 223, and the drain ($n^+$-type drain region 213) is electrically connected to a drain electrode 224b (wiring 224) via the plug 223.

Wiring 228 are respectively connected to the source electrode 224a and the drain electrode 224b via the plugs 227 within the through holes 226 formed in the insulating film (interlayer insulating film) 225 covering the source electrode 224a and the drain electrode 224b. A surface protective film (insulating film) 229 composed of a laminated film which consists of a silicon oxide film and a silicon nitride film is formed on the wiring 228. Although not shown, a pad electrode (bonding pad corresponding to an electrode 2a as described later) is formed by the wiring 228 exposed from an opening formed in the surface protective film 229 (and a gold film formed thereon, and the like). Furthermore, a back electrode (source back surface electrode) 230 is formed on the back surface of the semiconductor substrate 201.

The semiconductor amplification elements constituting the power amplifier circuits 102A and 102B (amplification stages 102A1 to 102A3, and 102B1 to 102B3) can be formed by the HBTs (Heterojunction Bipolar Transistor). However, a voltage (base voltage Vbe) of HBT corresponding to a threshold value of the MISFET is high (for example, about 1.25 V). In a multistage connection of amplification stages of the HBT, the voltage becomes higher (for example, when two stages are connected to each other, the base voltage becomes about 2.5 V), which can be equal to or greater than the power source voltage, resulting in failure in an operation of the HBT.

The greater the area of the HBT, the smaller the current density needed to obtain current required for the circuit structure (collector current Ice per pn junction area), so that the voltage (base voltage Vbe) corresponding to the threshold value of the HBT can be decreased by the same degree as that of the threshold voltage of the MISFET (for example, to about 0.7 to 0.9 V). However, if the area of the HBT is enlarged to decrease the current density (collector current Ice per pn junction area) in order to lower the voltage (base voltage Vbe) corresponding to the threshold value in the HBT, the area of one HBT will have the size that is several times (for example, four to five times) larger than that of the MISFET. Thus, when the power amplifier circuits are made of the HBTs, the area of the semiconductor chip with the power amplifier circuits (HBT) formed thereon becomes large. It is advantageous in terms of product size and costs to form the control circuit or the like in another semiconductor chip, rather than to build the control circuit into the semiconductor chip with the HBT formed therein.

In contrast, when the semiconductor amplification elements constituting the power amplifier circuits 102A and 102B (amplification stages 102A1 to 102A3, and 102B1 to 102B3) are formed by the MISFET elements (for example, the LDMOSFETs), the area of the semiconductor chip 2 with the MISFET elements formed thereon for constituting the power amplifier circuits 102A and 102B can be decreased as compared to the case of the HBT, which easily allows the above-mentioned peripheral circuit 103 to be incorporated into the same semiconductor chip 2. The MISFET elements constituting the power amplifier circuits 102A and 102B, and the MISFET element constituting the peripheral circuit 103 may be formed on the same silicon substrate (semiconductor substrate 201). For this reason, it is easy in terms of manufacturing steps to form both the power amplifier circuits 102A, 102B, and the peripheral circuit 103 within one semiconductor chip 2. Thus, the power amplifier circuits 102A and 102B are constituted by the MISFET elements, thereby decreasing the dimension (plane dimension) of the semiconductor chip 2. Furthermore, the number of semiconductor chips needed to constitute the RF power module 1 can be decreased (wherein since the chips required are the semiconductor chips 2 and 4, the number of chips in total can be set to two), so that the dimension (plane dimension) of the RF power module 1 can be reduced. The semiconductor amplification elements constituting the power amplifier circuits 102A and 102B (amplification stages 102A1 to 102A3, and 102B1 to 102B3) may be preferably formed of the MISFET elements (for example, LDMOSFETs).

As shown in FIGS. 9 and 10, the semiconductor chip 2 is die-bonded face-up to a conductive layer 14a over the upper surface 3a of the wiring board 3 with an adhesive, such as solder 15. A silver paste or the like can be used instead of the solder 15 for the die-bonding of the semiconductor chip 2. A plurality of electrodes (bonding pads, or terminals) 2a formed on the front surface (upper surface) of the semiconductor chip 2 are electrically connected to the respective substrate side terminals 12a (conductive patterns 12b) on the upper surface 3a of the wiring board 3 via the bonding wires (conductive wires) 8. On the back surface of the semiconductor chip 2, a back side electrode 2b is formed. The back side electrode 2b of the semiconductor chip 2 is connected (jointed) to the conductive layer 14a on the upper surface 3a of the wiring board 3 by a conductive adhesive, such as the solder 15, and further electrically connected to the terminal 12d for supply of the reference potential on the lower surface 3b of the wiring board 3 via the conductive film within the via hole 13 or the like.

A semiconductor chip 4 has a semiconductor integrated circuit formed thereon, and corresponding to the circuit structure enclosed by a dotted line indicating the semiconductor chip 4 in the circuit block diagram of FIG. 1. Thus, both switch circuits 109A and 109B are formed in the semiconductor chip 4 (or a surface layer part). The switch circuits 109A and 109B each are made of the HEMT element or the like as shown in FIG. 4, and thus the HEMT elements constituting the switch circuits 109A and 109B or the like are formed in the semiconductor chip 4. As mentioned above, the RF power module (electronic device) 1 has the switch circuits 109A and 109B for switching between transmission and reception, and the semiconductor chip 4 is an active element constituting the switch circuits 109A and 109B. The semiconductor chip 4 is obtained by the steps of forming a semiconductor integrated circuit on a semiconductor substrate (semiconductor wafer) made of, for example, GaAs or the like, grinding the back surface of the semiconductor substrate if necessary, and then separating the semiconductor substrate into semiconductor chips 4 by dicing or the like.

Figure 12:
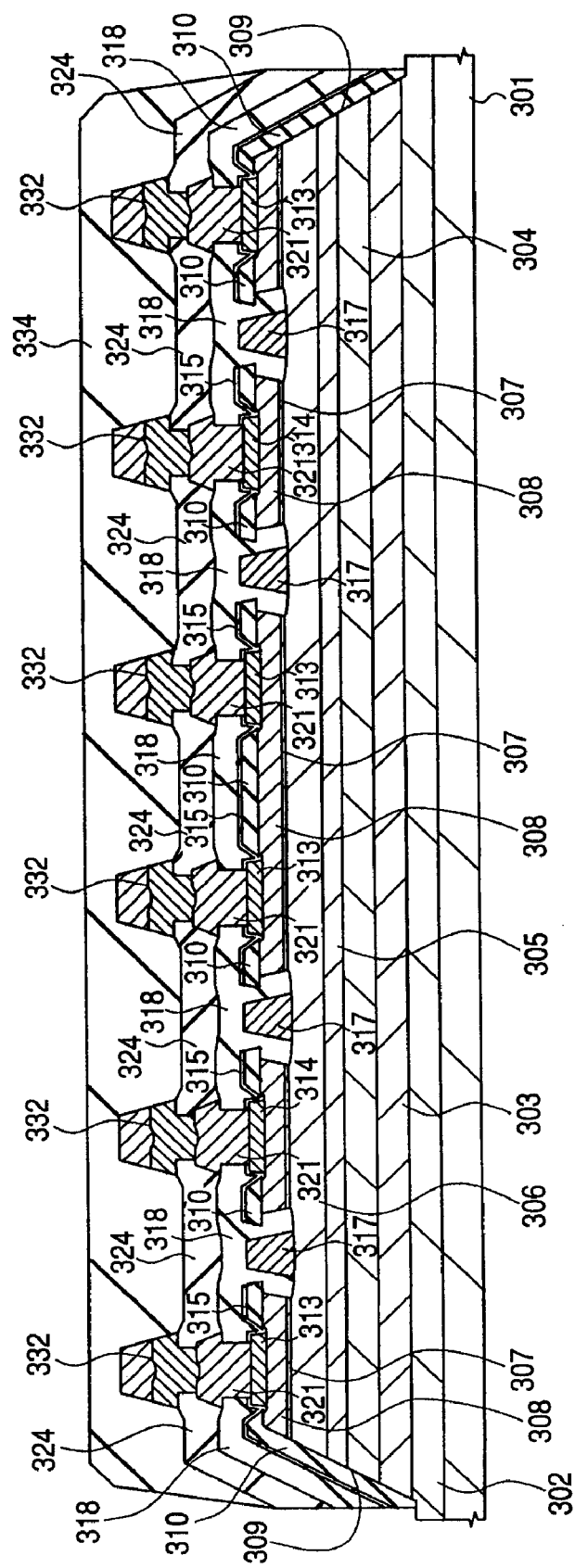
FIG. 12 is a sectional view of a main part of the semiconductor chip when the switch circuit is formed using a HEMT element.
Figure 13:
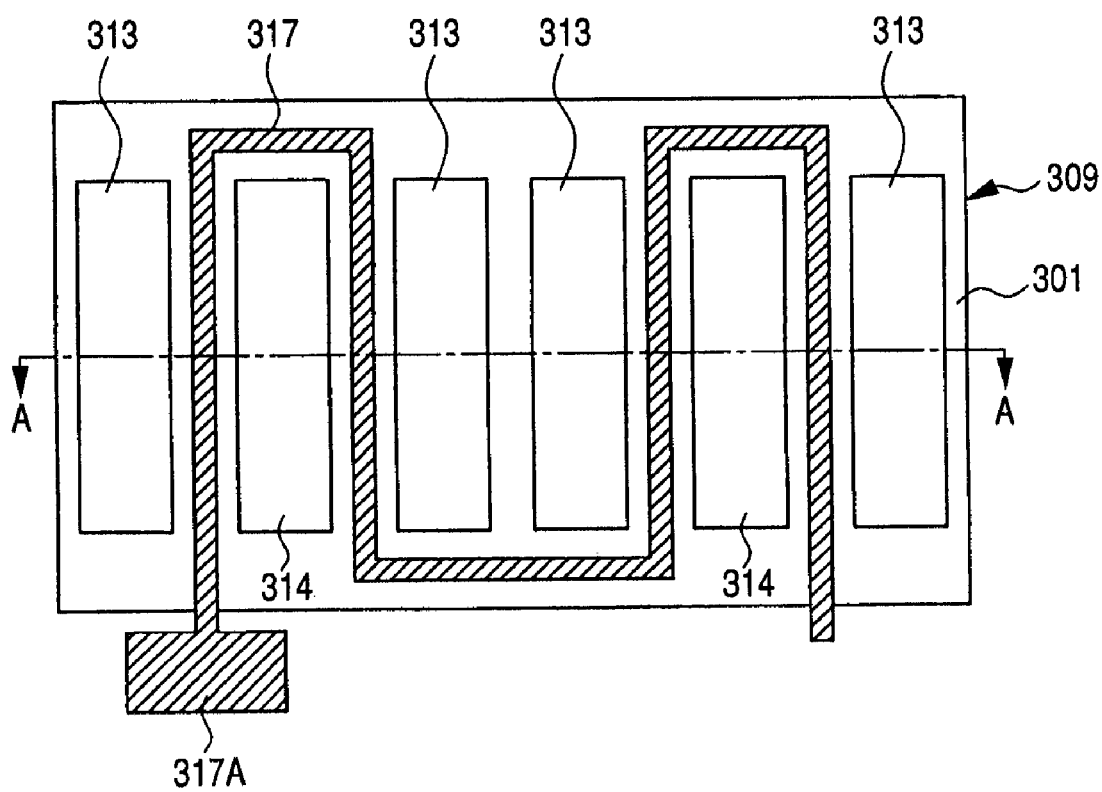
FIG. 13 is a plan view of a main part of the semiconductor chip of FIG. 12.

FIG. 12 is a sectional view of a main part of an example of the semiconductor chip 4 when the switch circuits 109A and 109B are formed using the HEMT elements, and FIG. 13 is a main plan view thereof. Note that FIG. 13 shows a plane layout of a source electrode 313, a drain electrode 314, a gate electrode 317, and a gate pad 317A, and illustration of other components is omitted. FIG. 13 is a plan view in which hatching is applied to the gate electrode 17 (and the gate pad 17A) for easy viewing of the accompanying drawings. Furthermore, the section of the region taken along a line A-A of FIG. 13 substantially corresponds to that in FIG. 14.

As shown in FIG. 12, a buffer layer 302, an electron supply layer 303, a channel layer 304, an electron supply layer 305, a Schottky layer (electron supply layer) 306, an interlayer film 307, and a cap layer 308 are formed in that order from the bottom by epitaxial growth on the main surface of the semiconductor substrate 301 made of GaAs, which is a semiconductor compound.

The buffer layer 302 is constituted of a laminated film including a non-doped GaAs layer, a non-doped AlGaAs layer, a non-doped GaAs layer, and a non-doped AlGaAs layer in that order from the bottom. The electron supply layer 303 is composed of an n$^+$-type AlGaAs layer, into which impurity ions having n-type conductivity (for example, silicon ions) are introduced. The channel layer 304 is composed of a laminated film including a non-doped AlGaAs layer, a non-doped GaAs layer, a non-doped InGaAs layer, a non-doped GaAs layer, and a non-doped AlGaAs layer in that order from the bottom. The electron supply layer 305 is composed of an n$^+$-type AlGaAs layer, into which impurity ions having the n-type conductivity (for example, silicon ions) are introduced. The Schottky layer 306 is composed of an n$^+$-type AlGaAs layer, into which impurity ions having the n-type conductivity (for example, silicon ions) are introduced. The interlayer film 307 is composed of an n$^+$-type AlGaAs layer, into which impurity ions having the n-type conductivity (for example, silicon ions) are introduced. The cap layer 308 is composed of an n$^+$-type GaAs layer, into which impurity ions having the n-type conductivity (for example, silicon ions) are introduced.

The cap layer 308, the interlayer film 307, the Schottky layer 306, the electron supply layer 305, the channel layer 304, and the electron supply layer 303 are partially removed around the semiconductor chip by a mesa etching method to form an element separation part (element separation region) 309. A silicon oxide film 310 is formed on the side walls of the cap layer 308, the interlayer film 307, the Schottky layer 306, the electron supply layer 305, the channel layer 304, and the electron supply layer 303, and on the cap layer 308.

The source electrode 313 and the drain electrode 314 are formed in ohmic contact with the cap layer 308 on the cap layer 308 exposed from the opening formed in the silicon oxide film 310. The gate electrode 317 is formed in Schottky contact with the Schottky layer 306 exposed from another opening formed in the silicon oxide film 310, the cap layer 308, and the interlayer film 307. On the silicon oxide film 310 except for the opening, a protective film 315 is formed which is made of a silicon oxide film or the like.

As illustrated in a plan view of FIG. 13, the gate electrode 317 is patterned so as to be located within a chip region enclosed by the element separation part 309 except for the gate pad 317A for connection with a contact hole extending from the wiring of the upper layer. Also, the gate electrode 317 is patterned such that it continuously lies in the form of one line within the chip region, extends longitudinally between the source electrode 313 and the drain electrode 314, as well as laterally in remaining other positions on the paper surface of FIG. 13. The gate electrode 317 disposed between the source electrode 313 and the drain electrode 314 continuously extends in the form of one line along the longitudinal and lateral directions on the paper surface within the chip region enclosed by the element separation part 309, with one end of the gate electrode 317 connected to the gate pad 317A, thereby downsizing the area of the gate pad 317A, and thus achieving reduction in size of the chip.

Referring to FIG. 12, an interlayer insulating film 318, such as a PSG (Phospho Silicate Glass) film, is formed over the silicon oxide film 310 (protective film 315) so as to fill in the opening with the source electrode 313 formed therein, the opening with the drain electrode 314 formed therein, and the opening with the gate electrode 317 formed therein. The interlayer insulating film 318 has an opening reaching the source electrode 313, an opening reaching the drain electrode 314, and an opening (not shown) reaching the gate pad 317A (see FIG. 13) formed thereon. Wiring 321 is formed on or over each of the source electrode 313, the drain electrode 314, and the gate pad 317A exposed from the respective openings of the interlayer insulating film 318 to be electrically connected to each of the source electrode 313, the drain electrode 314, and the gate pad 317A (gate electrode 317).

An interlayer insulating film 324 made of silicon oxide or the like is formed on the interlayer insulating film 318 to cover the wiring 321. An opening reaching the wiring 321 is formed in the interlayer insulating film 324. Wiring 332 is formed on the wiring 321 exposed from the opening of the interlayer insulating film 324 to be electrically connected to the wiring 321. A surface protective film (polyimide film) 334 is formed over the interlayer insulating film 324 to cover the wiring 332. Although not shown, a pad electrode (bonding pad corresponding to an electrode 4a as described later) is formed by the wiring 332 exposed from the opening formed in the surface protective film 334.

Although in the above description, the HEMT element or the like is formed in the semiconductor substrate (GaAs substrate) made of a semiconductor compound (GaAs) to form the semiconductor chip 4, in other embodiments, a SOS (Silicon On Sapphire) substrate may be used instead of the GaAs substrate, and the HEMT element or the like may be formed on the SOS substrate to form the semiconductor chip 4.

As shown in FIGS. 9 and 10, the semiconductor chip 4 is die-bonded face-up to the conductive layer 14b on the upper surface 3a of the wiring board 3 by an adhesive, such as solder 16. In die-bonding of the semiconductor chip 2, a silver paste or an insulating adhesive can be used instead of the solder 16. A plurality of electrodes (bonding pads, and terminals) 4a formed on the surface (front face) of the semiconductor chip 4 are electrically connected to the respective substrate side terminals 12a on the upper surface 3a of the wiring board 3 via the bonding wires (conductive wires) 9. In other embodiments, the electrode 4a of the semiconductor chip 4 serves as a bump electrode (protruding electrode), and the semiconductor chip 4 is mounted face-down on the upper surface 3a of the wiring board 3. Thus, the bump electrodes of the semiconductor chip 4 are connected to the substrate side terminals 12a on the upper surface 3a of the wiring board 3, that is, the semiconductor chip 4 can be flip-chip connected to the upper surface 3a of the wiring board 3.

The passive component (passive element, or chip component) 5 is composed of a passive element, such as a resistance element (for example, a chip resistor), a capacitance element (for example, a chip condenser), or an inductor element (for example, a chip inductor). The passive component is constructed of, for example, the chip component. The passive component 5 is a passive component constituting, for example, a matching circuit (an input matching circuit) 105A, 105B, or a matching circuit (output matching circuit) 107A, 107B. The passive elements constituting the matching circuits (interstage matching circuits) 102AM1, 102AM2, 102BM1, 102BM1 may be formed within the semiconductor chip 2, or may be formed by the passive components 5 without being formed in the semiconductor chip 2. The passive component 5 is implemented on the substrate side terminals 12a on the upper surface 3a of the wiring board 3 with an adhesive having good conductivity, such as solder 17.

The integrated passive component 6 is an integrated passive device (IPD) constituting each of the low pass filters 108A and 108B. Within the respective integrated passive components 6, the inductor elements 111a, 111b, 111c, and the capacitance elements 112a, 112b, 112c are formed to constitute the above-mentioned low pass filters 108A and 108B.

In the RF power module 1, two integrated passive components 6a and 6b each serving as the integrated passive component 6 are mounted over the upper surface 3a of the wiring board 3. One of the integrated passive components 6a is the integrated passive component 6 constituting the low pass filter 108A for the GSM 900, while the other integrated passive component 6b is the integrated passive component 6 constituting the low pass filter 108B for the DCS 1800. Thus, the inductor elements 111a, 111b, 111c, and the capacitance elements 112a, 112b, 112c which constitute the low pass filter 108A for the GSM 900 are formed within the integrated passive component 6a, while the inductor elements 111a, 111b, 111c, and the capacitance elements 112a, 112b, 112c which constitute the low pass filter 108A for the DCS 1800 are formed within the integrated passive component 6b.

In the embodiment, the term "integrated passive element (integrated passive components, IPD)" means a plurality of passive elements formed on the substrate, on which no active element is formed. The plurality of passive elements are formed by an electrically conductive layer and/or an insulating layer on the substrate, so that the integrated passive element is formed. Although in the embodiment, a semiconductor substrate mainly composed of silicon single crystal is used as the substrate included in the integrated passive element, in other embodiments an insulating substrate, such as a GaAs (gallium arsenide) substrate, a sapphire substrate, or a glass substrate, can also be used.

A plurality of bump electrodes (protruding electrodes) 18, which correspond to bump electrodes 64 as described later, are formed on the front surface (main surface or upper surface on the passive element forming side) 19a of each of the integrated passive components 6a and 6b. The bump electrode 18 is, for example, a solder bump. A gold bump or the like can be used as the bump electrode 18. The bump electrodes 18 are electrically connected to the passive elements (the inductor elements 111a, 111b, 111c, and the capacitance elements 112a, 112b, 112c) formed within the integrated passive component 6.

The integrated passive component 6 is flip-chip connected to the upper surface 3a of the wiring board 3. That is, the integrated passive component 6 is mounted (implemented) over the upper surface 3a of the wiring board 3 with its back surface (main surface or lower surface opposite to the front surface 19a) directed upward and with its front surface (main surface of the passive element forming side) 19a directed opposite to the upper surface 3a of the wiring board 3. Thus, the integrated passive component 6 is mounted face-down over the upper surface 3a of the wiring board 3. The plurality of bump electrodes 18 on the surface 19a of the integrated passive component 6 are respectively joined with and electrically connected to the respective substrate side terminals 12a on the upper surface 3a of the wiring board 3. Thus, the plurality of passive elements (the inductor elements 111a, 111b, 111c, and the capacitance elements 112a, 112b, 112c) formed in the integrated passive component 6, or low pass filters (low pass filter circuits) formed by the plurality of passive elements are electrically connected to the substrate side terminals 12a on the upper surface 3a of the wiring board 3 via the bump electrodes 18.

The substrate side terminals 12a of the upper surface 3a of the wiring board 3 to which the semiconductor chips 2 and 4, the passive component 5, or the integrated passive component 6 is electrically connected are connected to each other via a wiring layer on the upper surface of or inside the wiring board 3, or via the conductive film or the like in the via hole 13 if necessary. Furthermore, the substrate side terminals 12a are electrically connected to external connection terminals 12c or terminals for supply of a reference potential 12d on the lower surface 3b of the wiring board 3.

The seal resin 7 is formed over the wiring board 3 to cover the semiconductor chips 2, 4, the passive component 5, the integrated passive component 6, and the bonding wires 8 and 9. The seal resin 7 is made of a resin material, such as epoxy resin, or silicone resin, and can contain fillers or the like.

Now, the integrated passive component 6 used in the embodiment will be described in detail. First, one example of manufacturing steps of the integrated passive component 6 of the embodiment will be explained below with reference to the accompanying drawings.

FIGS. 14 to 19 are sectional views of main parts of the manufacturing steps of the integrated passive component 6 of the embodiment. The integrated passive component 6 of the embodiment can be manufactured, for example, as follows.

Figure 14:
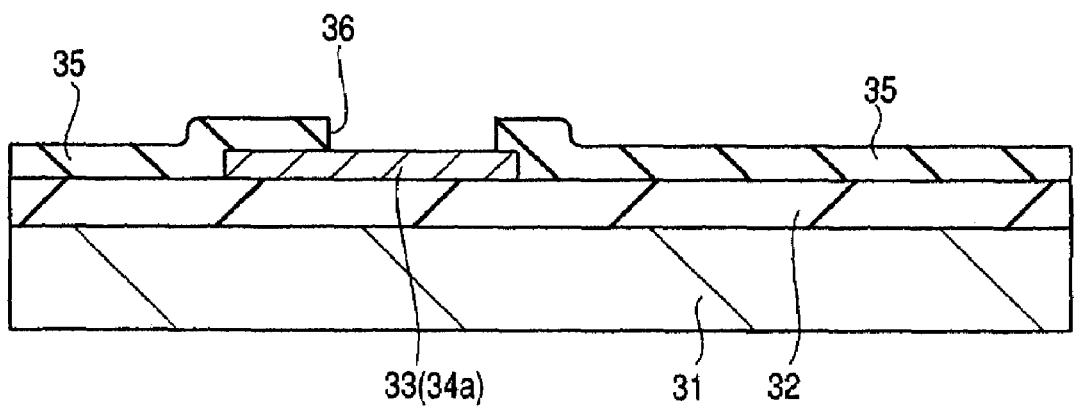
FIG. 14 is a sectional view showing a main part of a manufacturing step of an integrated passive component used in the RF power module of the embodiment.

First, as shown in FIG. 14, a semiconductor board (semiconductor wafer) 31 (herein after referred to as a substrate 31) made of, for example, silicon single crystal or the like, is prepared. The use of the semiconductor substrate made of the silicon single crystal as the substrate 31 facilitates manufacturing the integrated passive component 6, for example, by the so-called wafer process package technology (hereinafter referred to as a WPP) as will be described below. The technology involves collectively applying a package process with the wafer being maintained to a plurality of IPD chips formed on the wafer through a wafer process, for example. In other embodiments, an insulating substrate or the like, such as a GaAs (gallium arsenide) substrate, a sapphire substrate, or a glass substrate, can be used as the substrate 31.

Then, an insulating film 32 made of silicon oxide or the like is formed on the surface of the substrate 31. When using the insulating substrate (for example, the glass substrate) as the substrate 31, the formation of the insulating film 32 can be omitted.

An electrically conductive film (electrically conductive layer) mainly consisting of, for example, an aluminum (Al) alloy film is formed on the insulating film 32, and then patterned by a photolithography technology and a dry etching technology to form wiring (first layer wiring) 33, which is composed of the patterned electrically conductive film.

Then, an insulating film (interlayer insulating film) 35 made of a silicon oxide film or the like is formed over the substrate 31 (on the insulating film 32) to cover the wiring 33. Thereafter, a photoresist pattern (not shown) is formed on the insulating film 35 using the photolithography method, and the insulating film 35 is subjected to the dry etching using the photoresist pattern as an etching mask to form an opening (through hole) 36 in the insulating film 35. The wiring 33 (lower electrode 34a) is exposed at the bottom of the opening 36, and the part of the wiring 33 exposed from the opening 36 serves as the lower electrode 34a of a MIM (Metal Insulator Metal) type capacitance element (MIM capacitor) 34.

Figure 15:
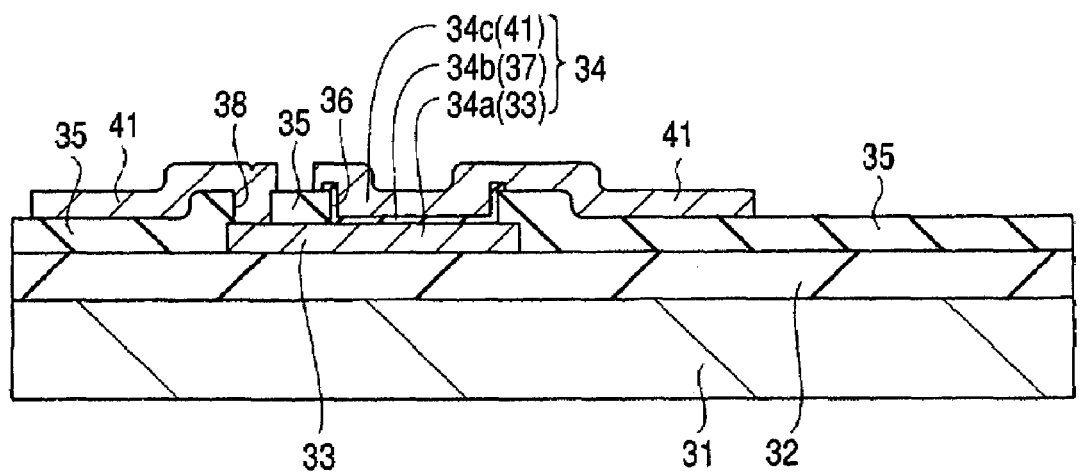
FIG. 15 is a sectional view showing a main part of a manufacturing step of the integrated passive component, following the step of FIG. 14.

Then, as shown in FIG. 15, an insulating film 37 (for example, a silicon nitride film or the like) serving as a capacitance insulating film of the capacitor is formed over the insulating film 35 including the bottom and side walls of the opening 36, and subjected to patterning using the photolithography method and the dry etching method. The insulating film patterned 37 remains over the lower electrode 34a (wiring 33) at the bottom of the opening 36 to serve as a capacitance insulating film 34b of the capacitance element 34.

Then, the insulating film 35 is subjected to the dry etching using the photoresist pattern (not shown) formed by the photolithography method as the etching mask to form an opening (through hole) 38 in the insulating film 35. The wiring 33 is exposed at the bottom of the opening 38.

An electrically conductive film mainly consisting of, for example, an aluminum (Al) alloy film is formed over the substrate 31 (on the insulating film 35) to cover the insides of the openings 36 and 38, and then patterned by the photolithography technology and the dry etching technology to form wiring (second layer wiring) 41, which is composed of the patterned electrically conductive film. The wiring 41 is electrically connected to the wiring 33 at the bottom of the opening 38. In the capacitor forming region, an upper electrode 34c of the MIM type capacitance element 34 is formed by the wiring 41 formed over the lower electrode 34a composed of the wiring 33 via the capacitance insulating film 34b (insulating film 37). The MIM type capacitance element 34 constituting each of the capacitance elements 112a, 112b, 112c is formed by the lower electrode 34a (wiring 33), the capacitance insulating film 34b (insulating film 37), and the upper electrode 34c (wiring 41).

Figure 16:
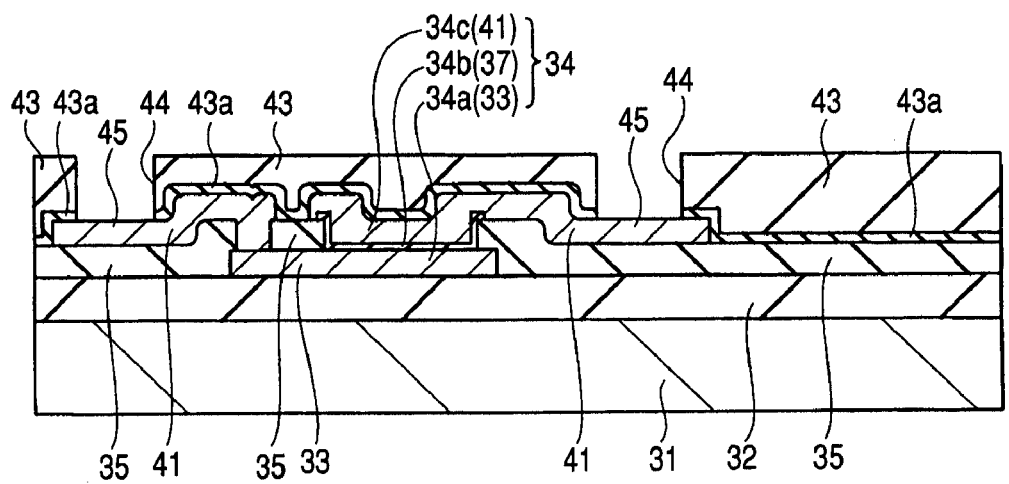
FIG. 16 is a sectional view showing a main part of a manufacturing step of the integrated passive component, following the step of FIG. 15.

Then, as shown in FIG. 16, a relatively thin insulating film 43a composed of a silicon oxide film, a silicon nitride film, or a laminated film thereof is formed to cover the wiring 41 over the substrate 31 (on the insulating 35), and a relatively thick insulating film (protective resin film) 43 serving as a surface protective film is formed on the insulating film 43a. The insulating film 43 can be formed of a film of a resin material, such as polyimide resin (resin material). The insulating films 43 and 43a are removed partially and selectively to form openings 44, and a part of wiring 41 is exposed at the bottom of the opening 44 to form a pad part (pad electrode) 45 composed of the wiring 41.

As mentioned above, the substrate 31 is subjected to the wafer process as shown in FIGS. 14 to 16. The wafer process is called preliminary step which generally involves forming various elements (passive elements) and the wiring layers (and the pad electrodes) on the main surface of the semiconductor wafer (substrate 31), and performing various electric tests of a plurality of chip regions (from each of which the IPD is formed) formed on the semiconductor wafer by a probe or the like after forming the surface protective film. Note that the above-mentioned insulating film 43 is the uppermost layer in the semiconductor wafer subjected to the wafer process.

Figure 17:
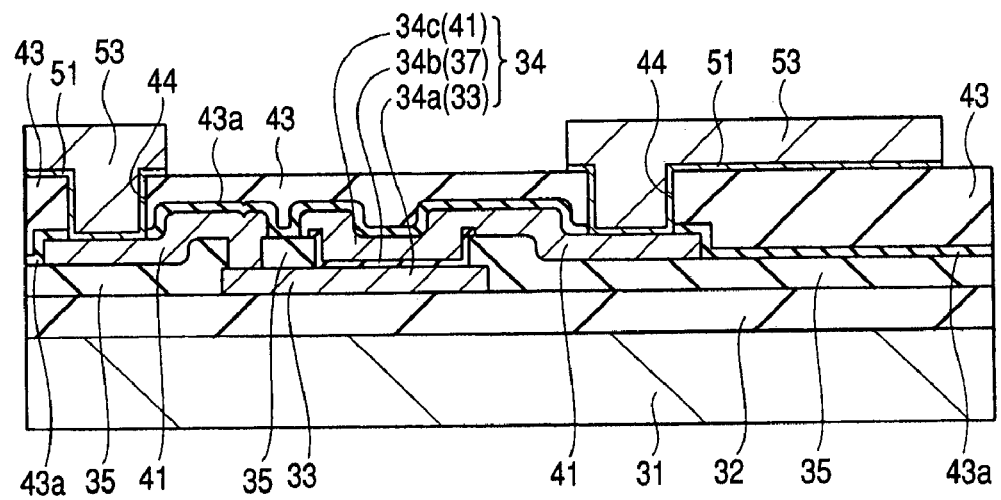
FIG. 17 is a sectional view showing a main part of a manufacturing step of the integrated passive component, following the step of FIG. 16.

After the structure shown in FIG. 16 is obtained at the above-mentioned wafer process (preliminary treatment) step, a seed film 51 made of a chrome (Cr) film or the like is formed over the substrate 31 (on the main surface on the side of forming the passive element thereof) as shown in FIG. 17. This can form the seed film 51 on the insulating film 43 including the pad 45 (wiring 41) exposed at the opening 44. Then, a photoresist pattern (not shown) is formed on the seed film 51. The photoresist pattern is formed in regions other than a region in which wiring 53 is to be formed as described later, and hence the seed film 51 is exposed in the region where the wiring 53 is to be formed.

Then, the wiring (rearrangement wiring layer, rewiring) 53 is formed using, for example, a plating method. For example, the wiring (third layer wiring) 53 made of a copper film (electrically conductive layer) can be formed on the seed film 51 exposed from the resist pattern by forming the copper film thereon. The wiring 53 is electrically connected to the wiring 41 (pad part 45) at the bottoms of the openings 44 of the insulating films 43 and 43a. The wiring 53 is formed over the insulating film 43 in a spiral pattern, so that spiral inductors (a spiral coil) constituting the inductor elements 111b and 111c are formed.

The insulating films 43a and 43 are formed on the wiring 41 as mentioned above, and the wiring 53 is formed over the insulating film 43. Therefore, the wiring (first conductive layer) 33 formed over the substrate 31, the wiring (second conductive layer) 41 positioned above the wiring (first conductive layer) 33, and the insulating film 37 (capacitance insulating film 34b) between the wiring 33 and the wiring 41 form the capacitance element 34 constituting each of the capacitance elements 112a, 112b, and 112c. Interlayer insulating films composed of the insulating films 43a and 43 are formed over the wiring 41, and the wiring (the third conductive layer) 53 formed on the interlayer insulating films forms the spiral inductor constituting each of the inductor elements 111b and 111c.

Thereafter, the resist pattern is removed and light etching is performed thereby to remove the part which is not covered with the wiring 53 of the seed film 51 (that is, the part covered with the resist pattern before being removed). This can obtain the structure of FIG. 17.

Figure 18:
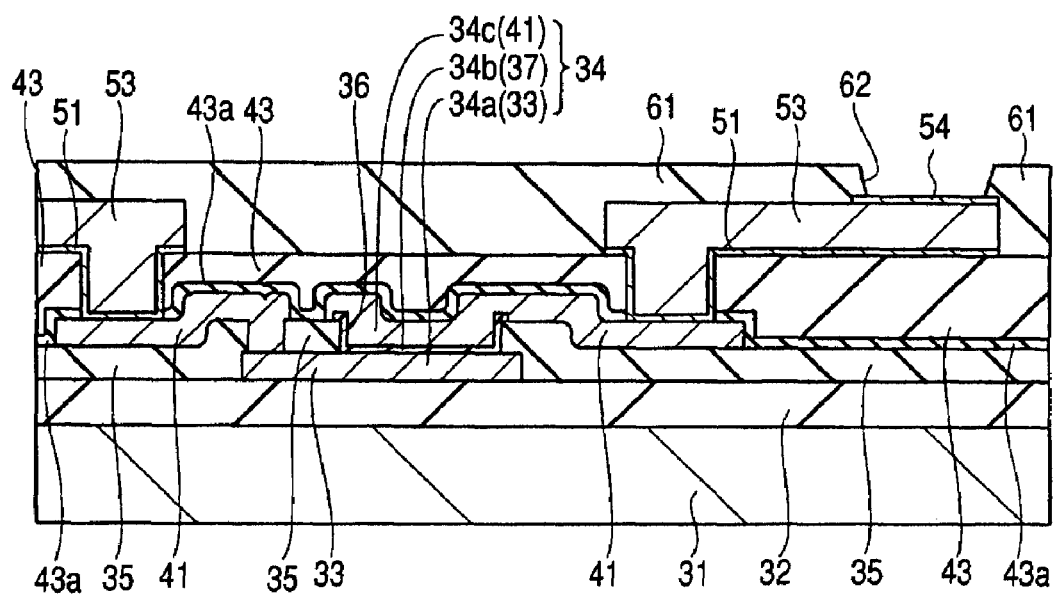
FIG. 18 is a sectional view showing a main part of a manufacturing step of the integrated passive component, following the step of FIG. 17.

Then, as shown in FIG. 18, a resist pattern (not shown) having openings is formed on the insulating film 43, and a nickel (Ni) film 54 is formed on the wiring 53 exposed at the bottom of the opening of the resist pattern using the plating method or the like. After forming the nickel film 54, the resist pattern is removed.

Then, an insulating film (passivation film) 61 made of a film of resin material, such as polyimide resin, is formed as a surface protective film over the substrate 31 (on the insulating film 43) to cover the wiring 53 and the nickel film 54. Thus, the wiring 53 is covered with the insulating film 61 serving as the surface protective film. The uppermost insulating film 61 is made of an organic insulating film, for example, of polyimide resin, and thus the relatively soft organic insulating film serves as the uppermost layer, thereby facilitating handling of the chip (integrated passive component). Furthermore, the uppermost insulating film 61 can be formed by a silicon oxide film, a silicon nitride film, or a laminated film thereof, thus permitting improvement of heat radiation characteristics of the spiral inductors (corresponding to the inductor elements 111b and 111c) formed by the wiring 53.

Then, an opening 62 is formed in the insulating film 61 to expose a part of the wiring 53. The nickel film 54 is exposed at the bottom of the opening 62.

Figure 19:
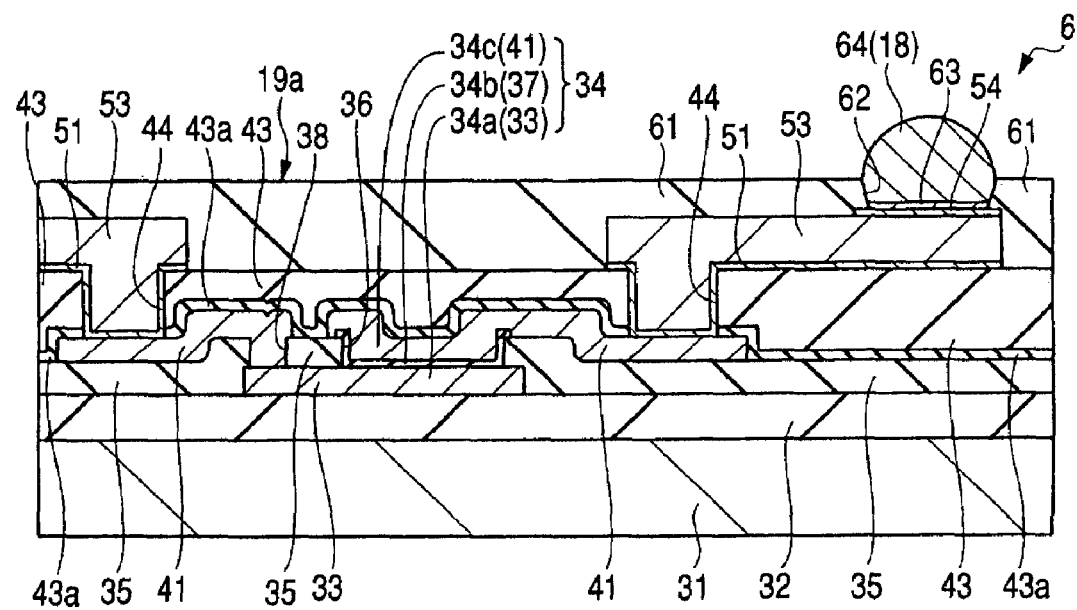
FIG. 19 is a sectional view showing a main part of a manufacturing step of the integrated passive component, following the step of FIG. 18.

As shown in FIG. 19, a gold (Au) film 63 is formed as a terminal surface film (bump primary metal coating) over the wiring 53 (on the nickel film 54 thereon) exposed at the opening 62, using the plating method or the like, for example. After forming the opening 62, the nickel film 54 can be formed on the wiring 53 exposed at the opening 62, and the gold (Au) film 63 can be formed on the nickel film 54.

Then, a bump electrode 64 (corresponding to the bump electrode 18 described above) is formed on the gold film 63 above the wiring 53 exposed at the opening 62. The bump electrode 64 is composed of, for example, a solder bump or the like. The bump electrode 64 can be formed by, for example, printing a solder paste by a printing process or the like and then applying heat treatment thereto. The bump electrode 64 (that is, the above-mentioned bump electrode 18) is a terminal of the integrated passive component 6 (an external connection terminal), and corresponds to the input terminal 116, the output terminal 117, or the ground terminals 118, 119 of the low pass filters 108A and 108B.

Then, the back surface of the substrate 31 is ground if necessary, and the substrate 31 is subjected to dicing (cutting). The substrate 31 serving as the semiconductor wafer is separated into individual chip regions by the dicing, which becomes the integrated passive components 6 separated.

In this way, the integrated passive component 6 of the embodiment is prepared (manufactured). Therefore, the integrated passive component 6 is the so-called wafer process package (WPP) which is obtained by collectively applying the package process with the wafer being maintained to the plurality of integrated passive component chips formed on the wafer through the wafer process as described above.

Now, one example of manufacturing steps of the RF power module 1 according to the embodiment will be described with reference to the accompanying drawings.

FIGS. 20 to 23 are sectional views of the manufacturing steps of the RF power module 1 of the embodiment. The RF power module 1 of the embodiment can be manufactured, for example, as follows.

Figure 20:
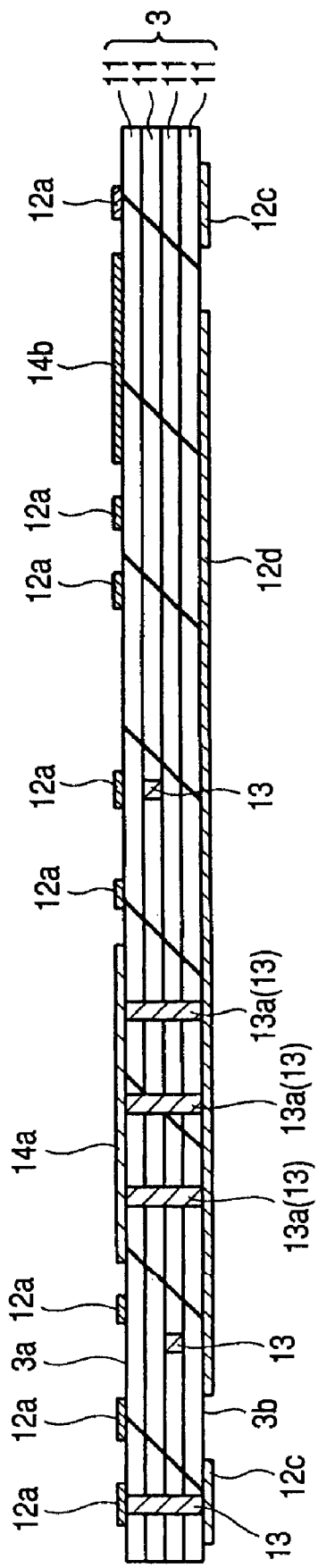
FIG. 20 is a sectional view of a manufacturing step of the RF power module of the embodiment.

First, as shown in FIG. 20, the wiring board 3 is prepared. The wiring board 3 can be manufactured by, for example, the printing method, a sheet lamination method, a build-up method, or the like.

Figure 21:
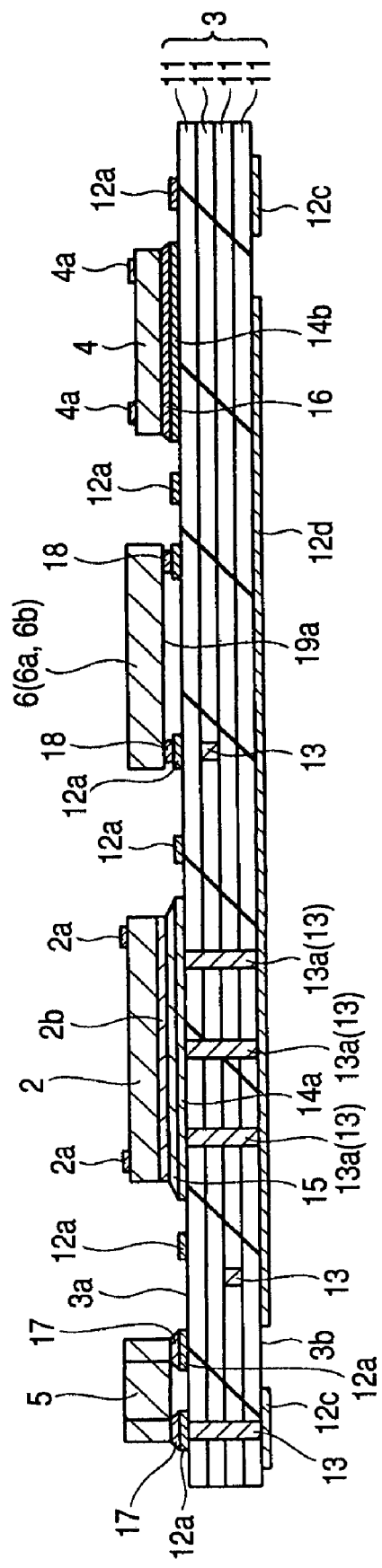
FIG. 21 is a sectional view showing a manufacturing step of the RF power module, following the step of FIG. 20.

Then, as shown in FIG. 21, an adhesive, such as solder, is printed or applied to the substrate side terminals 12a onto which the semiconductor chips 2, 4 of the wiring board 3, the passive component 5, the integrated passive component 6, and the like are mounted if necessary. Thereafter, the semiconductor chips 2, 4, the passive component 5, and the integrated passive components 6 (6a, 6b) are mounted over the upper surface 3a of the wiring board 3. At this time, the semiconductor chips 2 and 4 are mounted over the upper surface 3a of the wiring board 3 (on the conductive layers 14a and 14b thereof) with the back side (back side electrode 2b) directed downward (toward the wiring board 3 side) and with the front side directed upward (face-up bonding). Furthermore, the integrated passive component 6 is face-down bonded, and the solder bumps (bump electrodes 18) provided on the surface of the integrated passive component 6 are aligned to oppose the substrate side terminals 12a on the upper surface 3a of the wiring board 3.

Then, the semiconductor chips 2, 4, the passive component 5, and the integrated passive component 6 are fixed (connected) to the wiring board 3 via the adhesive, such as solder, by the solder reflow process or the like.

Figure 22:
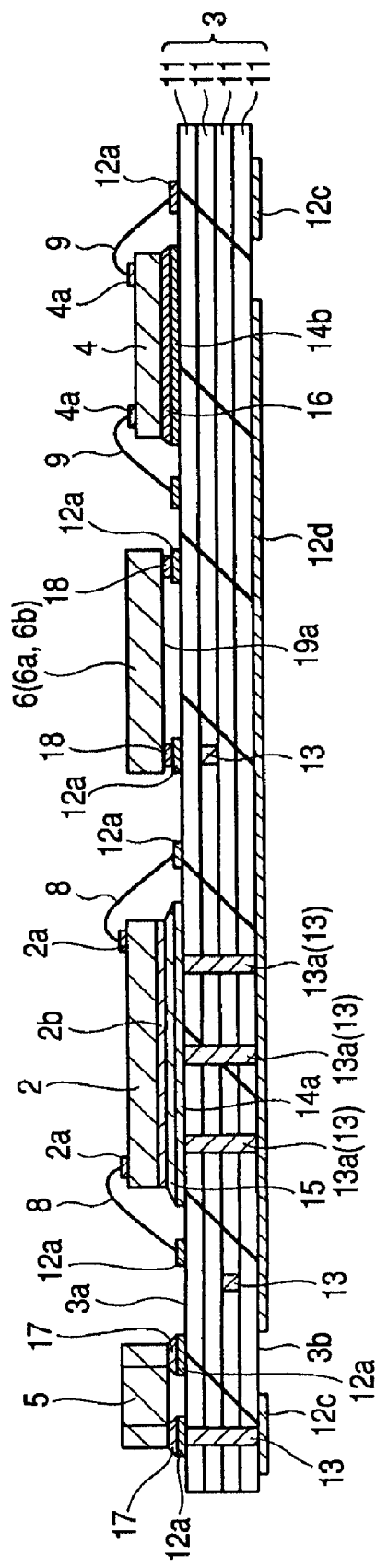
FIG. 22 is a sectional view showing a manufacturing step of the RF power module, following the step of FIG. 21.

Then, as shown in FIG. 22, the plurality of electrodes (bonding pads) 2a and 4a on the surface of the semiconductor chips 2 and 4, and the plurality of substrate side terminals 12a on the upper surface 3a of the wiring board 3 are electrically connected to one another via the plurality of bonding wires 8 and 9 by the wire bonding process.

Figure 23:
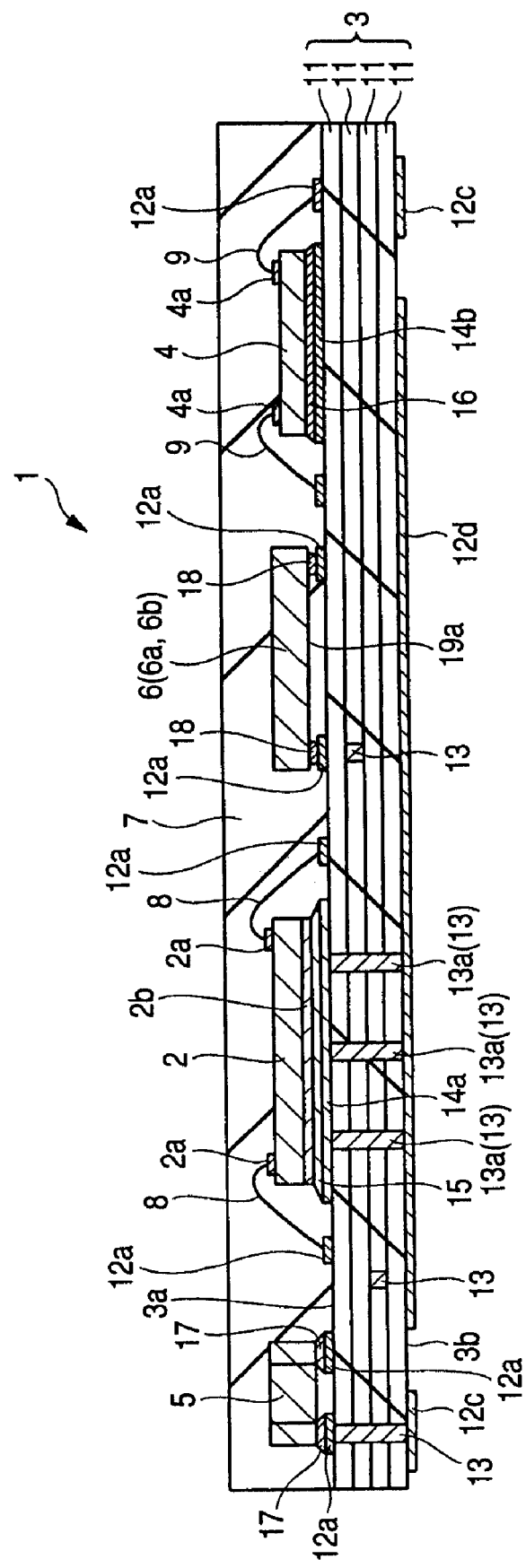
FIG. 23 is a sectional view showing a manufacturing step of the RF power module, following the step of FIG. 22.

Thereafter, as shown in FIG. 23, the seal resin 7 is formed over the upper surface 3a of the wiring board 3 to cover the semiconductor chips 2, 4, the passive component 5, the integrated passive components 6 (6a, 6b), and the bonding wires 8, 9. The seal resin 7 can be formed using, for example, the printing method, a mold for molding (for example, a transfer mold), or the like. In this way, the RF power module 1 is manufactured. In manufacturing a plurality of RF power modules 1 from one sheet of wiring board 3, the wiring board 3 and the seal resin 7 are divided (cut) at predetermined positions after forming the seal resin 7, into the individual RF power modules 1 separated.

The features of the RF power module 1 of the embodiment will be described below in more detail.

The RF power module 1 of the embodiment includes the semiconductor chip 2 constituting the power amplifier circuits 102A and 102B, and the semiconductor chip 4 constituting the switch circuits 109A and 109B respectively connected to the outputs of the power amplifier circuits 102A and 102B, which chips are mounted over the upper surface 3a of the wiring board 3. Since not only the power amplifier circuits 102A and 102B, but also the switch circuits 109A and 109B for switching between transmission and reception are provided in the RF power module 1, and the antenna ANT is connected to the terminal 106 of the RF power module 1 as shown in FIG. 3, another module (a front-end module or an antenna switch module) having the antenna switch circuit does not need to be provided between the RF power module 1 and the antenna ANT. This enables reduction in size and cost of the electronic device, such as the mobile communication device (cellular phone) on which the RF power module 1 is mounted. The switch circuits 109A and 109B are constructed in the semiconductor chip 4, which is mounted over the wiring board 3. This can advantageously reduce the plane size of the wiring board 3, leading to reduction in size (area) of the RF power module 1. Since both the switch circuit 109A for the GSM 900 and the switch circuit 109B for the DCS 1800 are formed in the same semiconductor chip 4, the number of components mounted on the wiring board 3 can be decreased, which enables reduction in size (area) and cost of the RF power module 1.

Furthermore, in the RF power module 1 of the embodiment, the integrated passive components 6a and 6b constituting the lowpass filters 108A and 108B are mounted over the upper surface 3a of the wiring board 3. Since not only the power amplifier circuits 102A and 102B, but also the low pass filters (low pass filter circuits) 108A and 108B are provided in the RF power module 1, another module (the front-end module or the antenna switch module) having the low pass filter circuit does not need to be provided between the RF power module 1 and the antenna ANT. This enables reduction in size and cost of the electronic device, such as the mobile communication device (cellular phone) on which the RF power module 1 is mounted.

Figure 24:
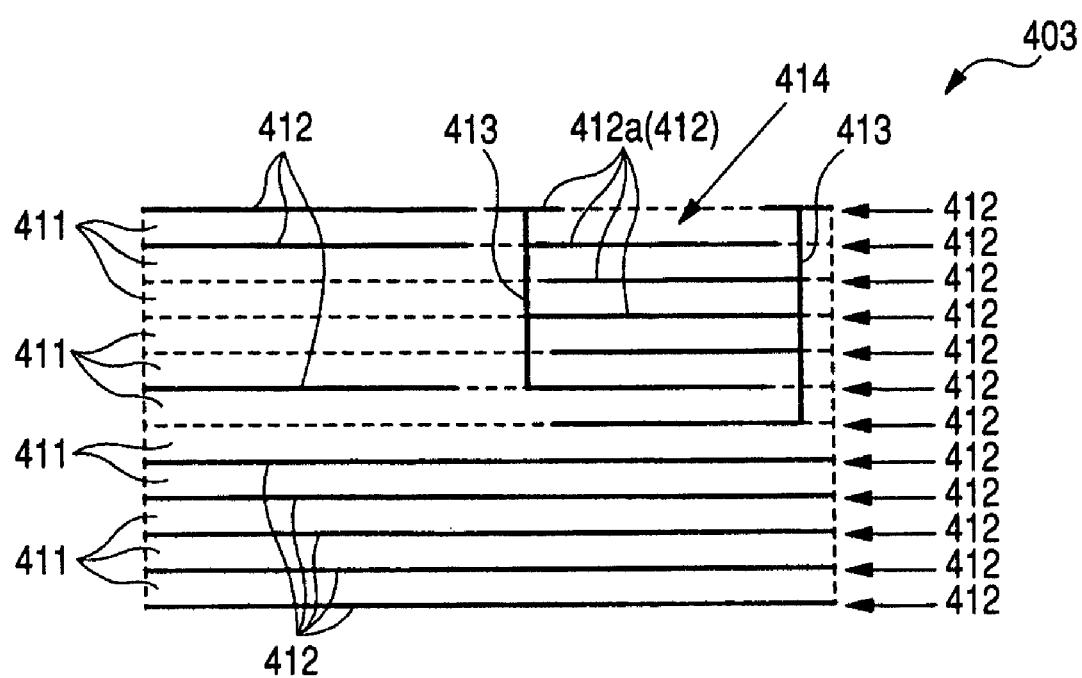
FIG. 24 is a schematic sectional view of a wiring board in a comparative example, which incorporates therein a low pass filter.

FIG. 24 is a schematic sectional view of a wiring board 403 of a comparative example when the low pass filters 108A and 108B are incorporated into the wiring board 403, unlike the invention.

The wiring board 403 of the comparative example shown in FIG. 24 has a laminated structure of 11 dielectric layers (insulating layers) 411, and 12 wiring layers, 412 which are composed of the wiring layers positioned between the dielectric layers 411 and the wiring layers positioned on the uppermost and lowermost surfaces of the dielectric layers. At an upper layer part on the right upper side in the wiring board 403 of FIG. 24, a capacity 414 is formed by the wiring layers 412a (parts of the wiring layers 412) alternately extending from a pair of conductors 413 in a direction opposed to each other. In the wiring board 403 of the comparative example, the capacitance elements 112a, 112b, 112c of the low pass filters (low pass filter circuits) 108A and 108B are formed by the capacity 414 incorporated into.

In the wiring board 403 of the comparative example, in order to ensure sufficient capacitance values of the capacitance elements 112a and 112b of the low pass filters (low pass filter circuits) 108A and 108B, the thickness of the dielectric layer 411 may be set small, or the number of the dielectric layers 411 and of the wiring layers 412 may be set large. Since the thinning of the dielectric layer 411 is limited, it is necessary to increase the number of the dielectric layers 411 and the wiring layers 412 as shown in FIG. 24 (for example, in FIG.

24, the number of dielectric layers 412 being 11.) This, however, may increase the thickness of wiring board 403, resulting in an increase in manufacturing unit cost of the wiring board 403. Thus, in manufacturing the RF power module using such a wiring board 403 of the comparative example, the thickness of the RF power module may be increased, and the manufacturing unit cost thereof may be enhanced.

In contrast, in the embodiment, the low pass filters 108A and 108B are formed in the RF power module 1, but constructed by the integrated passive components 6a and 6b mounted on the wiring board 3. This can prevent the increase in number of the insulating layers 11 of the wiring board 3 or in number of the wiring layers of the RF power module 1 even if the low pass filters 108A and 108B are formed in the RF power module 1. For example, the wiring board 3 can be formed with the number of the insulating layers 11 being four. This allows the slimming down of the RF power module.

In the embodiment, the integrated passive components 6a and 6b including the plurality of passive elements for the low pass filters 108A and 108B (the inductor elements 111a, 111b, 111c, and the capacitance elements 112a, 112b, 112c) formed on the semiconductor substrate are mounted over the wiring board 3 to form the RF power module 1. With this arrangement, this can reduce in size (area) of the RF power module 1 as compared to a case in which the individual passive elements for the low pass filters 108A and 108B (the inductor element 111a, 111b, 111c, and the capacitance elements 112a, 112b, 112c) are mounted as individual chip components over the wiring board 3.

Figure 25:
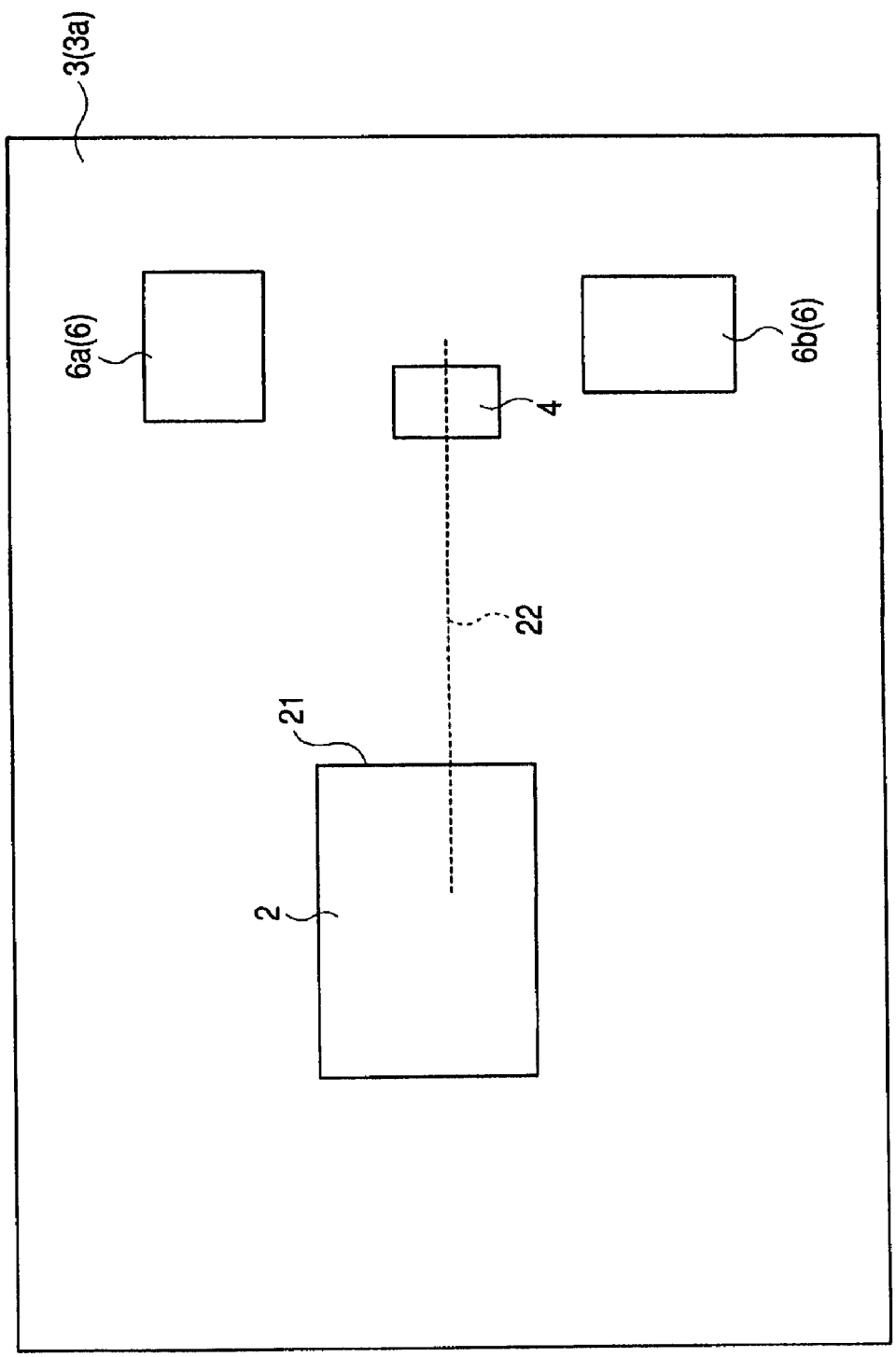
FIG. 25 is a top perspective drawing of a RF power module 1 according to one preferred embodiment of the invention.

FIG. 25 is a perspective drawing of an upper surface of the RF power module 1 of the embodiment, and showing an arrangement of positions (layout) of the semiconductor chips 2, 4 and the integrated passive components 6a, 6b over the upper surface 3a of the wiring board 3, while being seen through the seal resin 7. That is, FIG. 25 corresponds to a figure which is obtained by omitting from FIG. 9 the representation of any parts other than the semiconductor chips 2, 4, and the integrated passive components 6a and 6b on or over the upper surface 3a of the wiring board 3.

In the RF power module 1 of the embodiment, as shown in FIGS. 9 and 25, the semiconductor chip 4 constituting the switch circuits 109A and 109B is located between the integrated passive component 6a constituting the low pass filter 108A for the GSM 900 and the integrated passive component 6b constituting the low pass filter 108B for the DCS 1800 over the upper surface 3a of the wiring board 3. The semiconductor chip 4 constituting the switch circuits 109A and 109B is disposed next to (just beside) the semiconductor chip 2 constituting the power amplifier circuits 102A and 102B over the upper surface 3a of the wiring board 3. That is, as shown in FIG. 25, the semiconductor chips 2 and 4 are arranged over the upper surface 3a of the wiring board 3 such that the semiconductor chip 4 constituting the switch circuits 109A and 109B is positioned on a straight line 22 (conceptual line) orthogonal to one side (a side, a side face, or a side of the main surface of the semiconductor chip 2) 21 of the semiconductor chip 2 constituting the power amplifier circuits 102A and 102B. Note that the side 21 is a side opposed the semiconductor chip 4 among four sides of the semiconductor chip 2. FIG. 25 schematically represents the line 22 by a dotted line.

Furthermore, in the RF power module 1 of the embodiment, as shown in FIG. 9, the passive component 5 is not disposed between the integrated passive component 6a and the semiconductor chip 4, and between the integrated passive component 6b and the semiconductor chip 4 disposed over the upper surface 3a of the wiring board 3. Over the upper surface 3a of the wiring board 3, electrical connections are established between the integrated passive component 6a and the semiconductor chip 4, and between the integrated passive component 6b and the semiconductor chip 4 via the conductive pattern (12b) of the wiring board 3, or via the conductive pattern (12b) and the bonding wire (9) without involving the passive component 5.

The RF signal (high-frequency signal) of the GSM 900 amplified by the power amplifier circuit 102A formed in the semiconductor chip 2 is input to the low pass filter 108A formed in the integrated passive component 6a, via the matching circuit 107A composed of the passive component 5, where a harmonic component of the RF signal is cut off. Thus, the RF signal output from the integrated passive component 6a through the low pass filter 108A is input to the switch circuit 109A formed in the semiconductor chip 4. In contrast, the RF signal (high-frequency signal) of the DCS 1800 amplified by the power amplifier circuit 102B formed in the semiconductor chip 2 is input to the low pass filter 108B formed in the integrated passive component 6b, via the matching circuit 107B composed of the passive component 5, where a harmonic component of the RF signal is cut off. Thus, the RF signal output from the integrated passive component 6b through the low pass filter 108B is input to the switch circuit 109B formed in the semiconductor chip 4. Thus, both outputs of the integrated passive component 6a with the low pass filter 108A for the GSM 900 formed thereon, and of the integrated passive component 6b with the low pass filter 108B for the DCS 1800 formed thereon are input to the semiconductor chip 4 on which the switch circuits 109A and 109B for the GSM 900 and for the DCS 1800 are formed.

Since the RF signals output from the integrated passive components 6a and 6b (the low pass filters 108A and 108B) and input to the semiconductor chip 4 (the switch circuits 109A and 109B) are the RF signals amplified by the power amplifier circuits 102A and 102B, if the distances between the integrated passive components 6a and 6b and the semiconductor chip 4 are long, the loss of the signals output from the integrated passive components 6a and 6b to be input to the semiconductor chip 4 will become large. This could reduce addition effect (power addition effect) of the RF power module.

In the embodiment, as shown in FIGS. 9 and 25, the semiconductor chip 4 constituting the switch circuits 109A and 109B is disposed between the integrated passive component 6a constituting the low pass filter 108A for the GSM 900 and the integrated passive component 6b constituting the lowpass filter 108B for the DCS 1800, so that the semiconductor chip 4 can be disposed near both the integrated passive components 6a and 6b. That is, the integrated passive component 6a can be positioned near the semiconductor chip 4, and the integrated passive component 6b can also be positioned near the semiconductor chip 4. Thus, a connection path (a conductive pattern of the wiring board 3 or the like) between the integrated passive component 6a (lowpass filter 108A) and the semiconductor chip 4 (switch circuit 109A) can be shorten, and a connection path (a conductive pattern on the wiring board 3 or the like) between the integrated passive component 6b (low pass filter 108B) and the semiconductor chip 4 (switch circuit 109B) can be shorten. Accordingly, both the outputs of the integrated passive components 6a and 6b can be input to the switch circuits 109A and 109B of the semiconductor chip 4 at the shortest distance. This can reduce the loss in the signal outputted from the integrated passive components 6a and 6b (low pass filters 108A and 108B) to be input to the semiconductor chip 4 (switch circuits 109A and 109B), thereby improving the addition effect (power addition effect) of the RF power module.

In the embodiment, the passive component 5 is not disposed between the integrated passive components 6a and 6b and the semiconductor chip 4 over the upper surface 3a of the wiring board 3. This advantageously serves to shorten the connection path (the conductive pattern of the wiring board 3 or the like) between the integrated passive components 6a and 6b and the semiconductor chip 4. Also, in the embodiment, the integrated passive components 6a, 6b and the semiconductor chip 4 are electrically connected to one another via the conductive patterns 12b of the wiring board 3 or via the conductive patterns (12b) and the bonding wires 9 without involving the passive component 5. This advantageously serves to reduce the loss of the signals output from the integrated passive components 6a and 6b to be input to the semiconductor chip 4. Thus, the addition effect of the RF power module 1 can be further improved.

Note that as shown in FIGS. 9 and 10, when the semiconductor chip 4 is die-bonded face-up to the upper surface 3a of the wiring board 3, and the electrode 4a of the semiconductor chip 4 and the substrate side terminal 12a of the wiring board 3 are wire-bonded to each other, the integrated passive components 6a and 6b and the semiconductor chip 4 are electrically connected to one another via the conductive patterns (12b) of the wiring board 3 and the bonding wires 9 without involving the passive component 5. In other embodiments, the electrode 4a of the semiconductor chip 4 serves as the bump electrode, and the semiconductor chip 4 can be flip-chip connected to the upper surface 3a of the wiring board 4. In this case, the integrated passive components 6a and 6b and the semiconductor chip 4 are electrically connected to one another via the conductive patterns (12b) of the wiring board 3 without involving the passive component 5.

In the embodiment, the control circuit 103C for controlling the switch circuits 109A and 109B is formed within the semiconductor chip 2, thereby supplying the control signals of the switch circuits 109A and 109B (the above-mentioned switch signals CNT1 and CNT2) from the semiconductor chip 2 (control circuit 103C) to the semiconductor chip 4 (switch circuits 109A and 109B). Since in the embodiment the semiconductor chip 4 is disposed next to (just beside) the semiconductor chip 2 over the upper surface 3a of the wiring board 3 (that is, the semiconductor chip 4 is positioned on the line (22) orthogonal to one side (21) of the semiconductor chip 2), the connection path between the semiconductor chips 2 and 4 (the conductive pattern of the wiring board 3) can be shorten, which facilitates the layout of the wiring (conductive patterns 12b) on the wiring board 3. Thus, over the upper surface 3a of the wiring board 3, the semiconductor chip 2 and the semiconductor chip 4 are electrically connected to each other via the conductive pattern (12) of the wiring board 3, or via the conductive pattern (12) and the bonding wires 8 and 9, so that the control signals of the switch circuits 109A and 109B are supplied from the semiconductor chip 2 to the semiconductor chip 4 via the conductive pattern (12) of the wiring board 3, or via the conductive pattern (12) and the bonding wires 8 and 9. Accordingly, the control signals (switching signals CNT1 and CNT2) can be supplied at the shortest distance from the semiconductor chip 2 (control circuit 103C) to the semiconductor chip 4 (switch circuits 109A, 109B). The control signals (switch signals CNT1 and CNT2) of the switch circuits 109A and 109B are not readily affected by noise, thereby preventing malfunction of switching of the switch circuits 109A and 109B.

The RF power module 1 is configured to be capable of amplifying the RF signals (high-frequency signals) of the two systems of the GSM 900 and the DCS 1800. Thus, the power amplifier circuit, the lowpass filter, and the switch circuit are required for each of the two systems. Without any measures for the layout of each component, this could lead to increase in complexity of the layout of the wiring on the wiring board 3, and in size of the RF power module due to the increase in size of the wiring board 3.

In the embodiment, the power amplifier circuits 102A and 102B of the two systems (GSM 900 and DCS 1800) are formed in one semiconductor chip 2, the switch circuits 109A and 109B of the two systems (GSM 900 and DCS 1800) are formed in one semiconductor chip 4, and the low pass filters 108A and 108B of the two systems (GSM 900 and DCS 1800) are formed in the two integrated passive components 6a and 6b, respectively. As shown in FIG. 9, the semiconductor chip 4 is disposed between the integrated passive component 6a and the integrated passive component 6b over the upper surface 3a of the wiring board 3, and positioned next to (just beside) the semiconductor chip 2. Thus, the semiconductor chip 2 and the semiconductor chip 4 are laterally arranged in parallel to each other. In the forward and backward parts over the wiring board with respect to the chips, the components for the GSM 900 (the passive component 5 constituting the matching circuit 107A, and the integrated passive component 6a), and the components for the DCS 1800 (the passive component 5 constituting the matching circuit 107B, and the integrated passive component 6b) can be gathered and arranged respectively. For example, as shown in FIG. 9, over the upper surface 3a of the wiring board 3, the components for the GSM 900 (the passive component 5 constituting the matching circuit 107A and the integrated passive component 6a) are gathered and arranged at the upper right region of FIG. 9, while the components for the DCS 1800 (the passive component 5 constituting the matching circuit 107B and the integrated passive component 6b) are gathered and arranged at the lower right region of FIG. 9. Thus, the RF signal of the GSM 900 amplified by the power amplifier circuit 102A within the semiconductor chip 2 can be input to the switch circuit 109A of the semiconductor chip 4 via the gathered components for the GSM 900 (the passive component 5 constituting the matching circuit 107A and the integrated passive component 6a). Also, the RF signal of the DCS 1800 amplified by the power amplifier circuit 102B within the semiconductor chip 2 can be input to the switch circuit 109B of the semiconductor chip 4 via the gathered components for the DCS 1800 (the passive component 5 constituting the matching circuit 107B and the integrated passive component 6b). This can facilitate both of the layout of the wiring of the wiring board 3 for connecting among the semiconductor chip 2, the components for the GSM 900 (the passive component 5 constituting the matching circuit 107A and the integrated passive component 6a), and the semiconductor chip 4, as well as the layout of the wiring of the wiring board 3 for connecting among the semiconductor chip 2, the components for the DCS 1800 (the passive component 5 constituting the matching circuit 107B and the integrated passive component 6b), and the semiconductor chip 4. Thus, the layouts of the wiring on the wiring board 3 can be simplified, resulting in reduction in size of the wiring board 3, thereby decreasing the size of the RF power module 1.

In the embodiment, the inductor element 70 formed by the conductive layer of the wiring board 3 is incorporated into the wiring board 3. The inductor element 70 is used for each of the matching circuits (output matching circuits) 107A and 107B. The inductor element 70 can be constructed of a helical coil formed by the conductive layer of the wiring board 3 in a spiral pattern. For example, a round pattern partially breaking (for example, in a turned square U-shaped or C-shaped pattern) is formed by the conductive pattern 12b on the upper surface 3a of the wiring board 3 and by the conductive layers between the plurality of insulating layers 11 of the wiring board 3 with the insulating films 11 sandwiched therein and laminated, which may be connected to the conductor or conductive film within the via hole 13. In this way, the inductor element 70 is formed over the wiring board 3 which has an extending direction of the spiral defined by a thickness direction of the wiring board 3.

In the embodiment, at least one part of the inductor element for formation of each of the matching circuits (output matching circuits) 107A and 107B is constituted not using a chip inductor, but using the inductor element 70 made of the conductive layer of the wiring board 3, which can reduce unit cost (manufacturing unit cost) of the RF power module 1.

Furthermore, since in the embodiment the switch circuits 109A and 109B are incorporated into the RF power module 1, the control signals (switch signals CNT1 and CNT2) for controlling the switch circuits 109A and 109B need to be supplied to the semiconductor chip 4 (switch circuit 109A and 109B). Within the semiconductor chip 2 constituting the power amplifier circuits 102A and 102B, the control circuit 103C for the switch circuits 109A and 109B is further provided for supplying the control signals (switching signals) from the semiconductor chip 2 (control circuit 103C) to the semiconductor chip 4 (switch circuits 109A and 109B). Based on the control signal or the like supplied from the circuit part 152 outside the RF power module 1 to the semiconductor chip 2 (control circuit 103C) via the external connection terminal 12c of the RF power module 1, the control signals (switch signals) of the switch circuits 109A and 109B are supplied from the semiconductor chip 2 (control circuit 103C) to the semiconductor chip 4. Thus, as compared with a case in which the switch circuits 109A and 109B are not formed in the RF power module, in the embodiment, many signals are input into and output from the semiconductor chip 2 with the power amplifier circuits 102A and 102B and the control circuit 103C formed thereon, resulting in increased number of the electrodes 2a in the semiconductor chip 2. That is, the number of electrodes 2a in the semiconductor chip 2 is increased by the value associated with the control circuit 103C.

Figure 26:
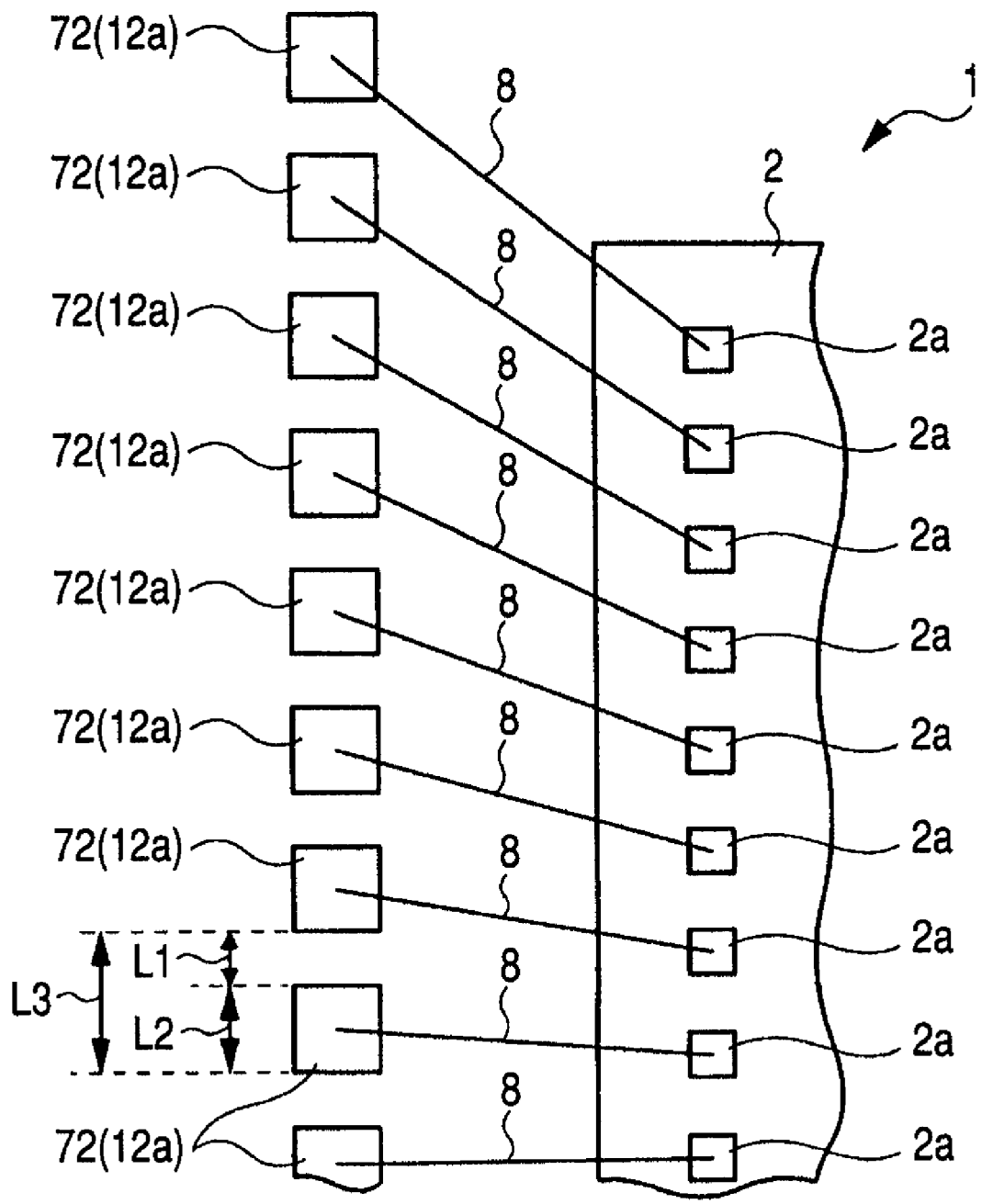
FIG. 26 is a main plan view showing the vicinity of a semiconductor chip in the RF power module of the embodiment.
Figure 27:
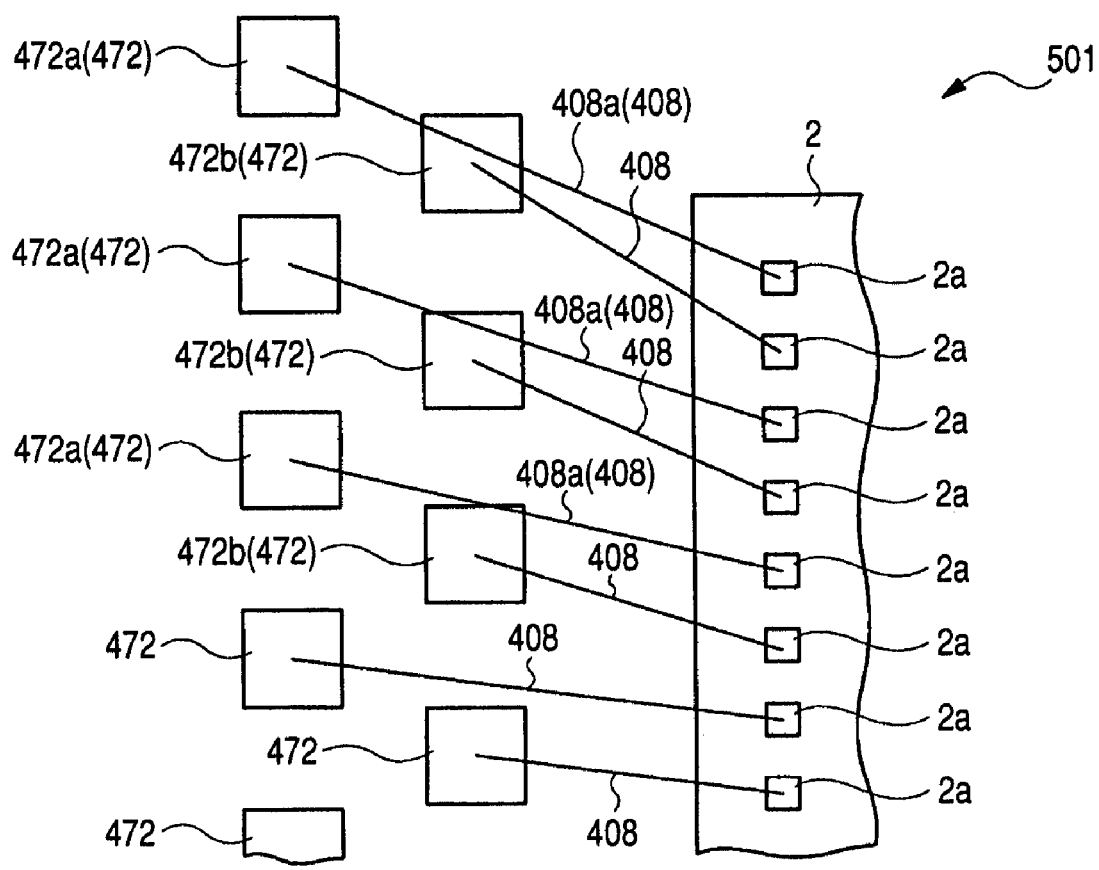
FIG. 27 is a main plan view showing the vicinity of a semiconductor chip in an RF power module of a comparative example.

FIG. 26 is a plan view of a main part near the semiconductor chip 2 in the RF power module 1 of the embodiment. FIG. 27 is a plan view of a main part near the semiconductor chip 2 in an RF power module 501 of a comparative example.

In the embodiment, as shown in FIG. 26, a plurality of substrate side terminals 72 to be respectively connected to the plurality of electrodes 2a of the semiconductor chip 2 via the plurality of bonding wires 8 are arranged not in a zigzag manner, but in line around the semiconductor chip 2 over the upper surface 3a of the wiring board 3. This can prevent each bonding wire 8 connected to the corresponding substrate side terminal 72 from passing through another substrate side terminal 72 having a potential that is different from that of the substrate side terminal 72 connected to the bonding wire 8. The substrate side terminals 72 among the substrate side terminals 12a are substrate side terminals (bonding pad, pad electrodes, electrodes, and terminals) connected to the bonding wires 8.

In contrast, in the RF power module 501 of the comparative example of FIG. 27, the plurality of substrate side terminals 472 (corresponding to the substrate side terminals 72 of the embodiment), which are to be respectively connected to the plurality of electrodes 2a of the semiconductor chip 2 via a plurality of bonding wires 408 (corresponding to bonding wires 8 of the embodiment), are arranged in a zigzag manner (in lines) around the semiconductor chip 2 over the upper surface 3a of the wiring board 3. Thus, in the RF power module 501 of the comparative example, as shown in FIG. 27, among the bonding wires 408, some bonding wires 408a connected to the substrate side terminals 472a pass through and on other substrate side terminals 408b.

When the substrate side terminal 472a connected to the bonding wire 408a has the same potential as that of the other substrate side terminal 408b through and on which the bonding wire 408a passes in the RF power module 501 of the comparative example shown in FIG. 27, noise is not input to the bonding wire 408a. However, if the substrate side terminal 472a to which the bonding wire 408a is connected has a different potential from that of the other substrate side terminal 408b through and on which the bonding wire 408a passes, noise may be input to the bonding wire 408a, and be input to the semiconductor chip 2 via the bonding wire 408a. That is, when the bonding wire 408a passes through and onto the substrate side terminal 472b having the different potential from that of the substrate side terminal 472a to which the bonding wire 408a is connected, the noise may be input to the semiconductor chip 2 via the bonding wire 408a. Since the power amplifier circuits 102A and 102B are formed in the semiconductor chip 2, when the noise is input to the semiconductor chip 2 via the bonding wire 408a, the power amplifier circuits 102A and 102B can oscillate. This can reduce the performance of the RF power module.

In contrast, in the RF power module 1 of the embodiment, as shown in FIG. 26, the plurality of electrodes 2a (first electrodes) of the semiconductor chip 2 and the plurality of substrate side terminals 72 (second electrodes) of the wiring board 3 are electrically connected to one another via the plurality of bonding wires 8 over the upper surface 3a of the wiring board 3. Each of the plurality of bonding wires 8 is adapted not to pass through and on the substrate side terminal 72 (second electrode) having a potential different from that of the substrate side terminal 72 (second electrode) to which the corresponding bonding wire is connected. This can prevent the noise from being input into the semiconductor chip 2 via the bonding wires 8, prevent oscillation of the power amplifier circuits 102A and 102B formed in the semiconductor chip 2, and improve the performance of the RF power module 1.

As mentioned above, in the embodiment, the number of electrodes 2a in the semiconductor chip 2 is increased because the control circuit 103C is formed in the chip 2, and hence the number of substrate side terminals 72 to be connected to the semiconductor chip 2 via the bonding wires 8 is also increased. However, even when the number of the substrate side terminals 72 to be connected to the semiconductor chip 2 via the bonding wires 8 is increased, if these substrate side terminals 72 are arranged in a zigzag manner like the comparison example of FIG. 27, there can pose problems of input of the noise into the semiconductor chip 2, of oscillation of the power amplifier circuits 102A and 102B, and the like. For this reason, in the embodiment, even if the dimension or the pitch of arrangement of the substrate side terminals 72 to be connected to the semiconductor chips 2 via the bonding wires 8 becomes small, the plurality of substrate side terminals 72 to be respectively connected to the plurality of electrodes 2a of the semiconductor chip 2 via the plurality of bonding wires 8 are arranged not in the zigzag manner, but in line around the semiconductor chip 2 over the upper surface 3a of the wiring board 3. For example, when a dimension L2 of the substrate side terminal 72 connected to the bonding wire 8 is about 150 μm, a distance L1 between the terminals is 100 μm, and a pitch L3 is set to about 250 μm, these terminals are arranged in line. Thus, each bonding wire 8 can be prevented from passing through and on the substrate side terminal 72 having the potential different from that of the substrate side terminal 72 connected to the corresponding bonding wire 8. This can prevent input of the noise into the semiconductor chip 2, and prevent oscillation of the power amplifier circuits 102A and 102B.

Furthermore, in the embodiment, not only the passive components 5, but also the integrated passive components 6 are mounted as the passive element over the upper surface 3*a* of the wiring board 3. The passive component 5 is constructed of, for example, a chip resistor, a chip capacitor, or a chip inductor, which is a potential component with two terminals having electrodes on both ends. The potential component has the electrodes formed on parts of both end faces and sides thereof. Thus, when the electrode of the passive component 5 is connected to the substrate side terminal 12*a* on the upper surface 3*a* of the wiring board 3 with the solder 17, the solder 17 sucks up the electrode parts on both end faces and the sides of the passive component 5. Confirmation of the suction of the solder 17 can judge whether or not the position of the passive component 5 deviates from a position in which the passive component should be originally mounted over the upper surface 3*a* of the wiring board 3 (if the position is aligned, the sucking of the solder is caused, but if the position deviates from the original position, the sucking up of the solder is not caused.)

However, the integrated passive component 6 includes a plurality of passive elements (the capacitance elements 34 constituting the inductor elements 111*a*, 111*b*, 111*c*, and the spiral inductors constituting the capacitance elements 112*a*, 112*b*, 112*c*) formed on the substrate 31 as shown in FIG. 19. The integrated passive component 6 is electrically connected to the substrate side terminals 12*a* on the upper surface 3*a* of the wiring board 3 via the bump electrodes 18, such as a solder bump. Thus, no electrode is formed on the side of the integrated passive component 6, and even if the bump electrode 18 is made of solder, the solder does not suck up the electrode at the side of the integrated passive component 6. This makes it difficult to determine whether the position of the integrated passive component 6 over the upper surface 3*a* of the wiring board 3 deviates from the original position where the component should be mounted, based on the sucking up of the solder at the side of the integrated passive component 6.

For this reason, in the embodiment, a pattern for identifying the position of the integrated passive component 6 (corresponding to patterns for position identification 89*a* and 89*b* as will be described below) is formed over the upper surface 3*a* of the wiring board 3 as will be described later.

Figure 28:
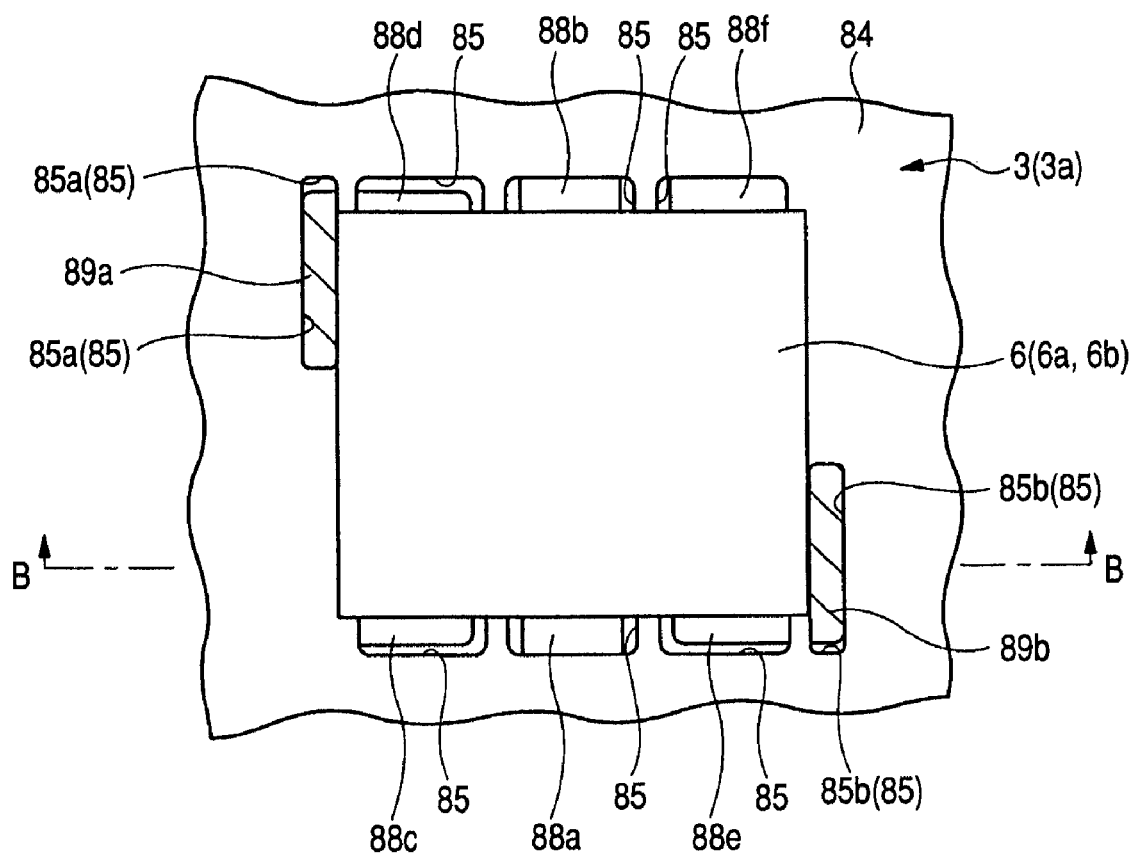
FIG. 28 is a main plan view of the RF power module of the embodiment.
Figure 29:
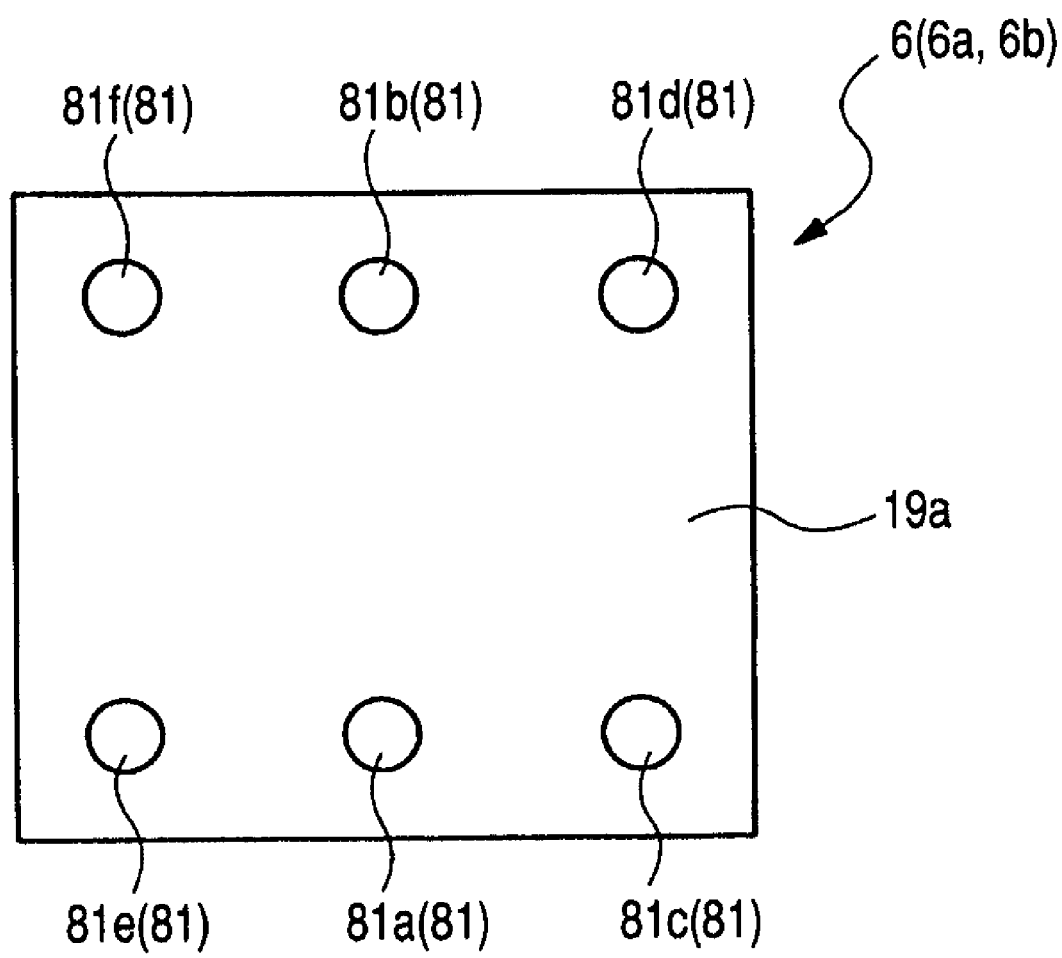
FIG. 29 is a plan view of the integrated passive component.
Figure 30:
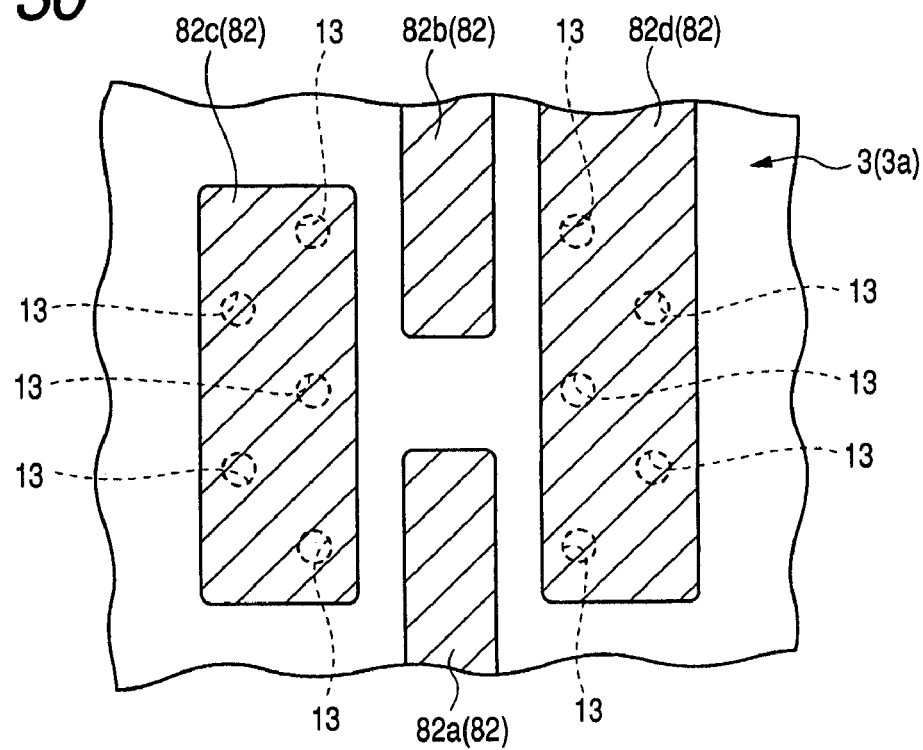
FIG. 30 is a main top view of the wiring board before mounting the integrated passive component.
Figure 31:
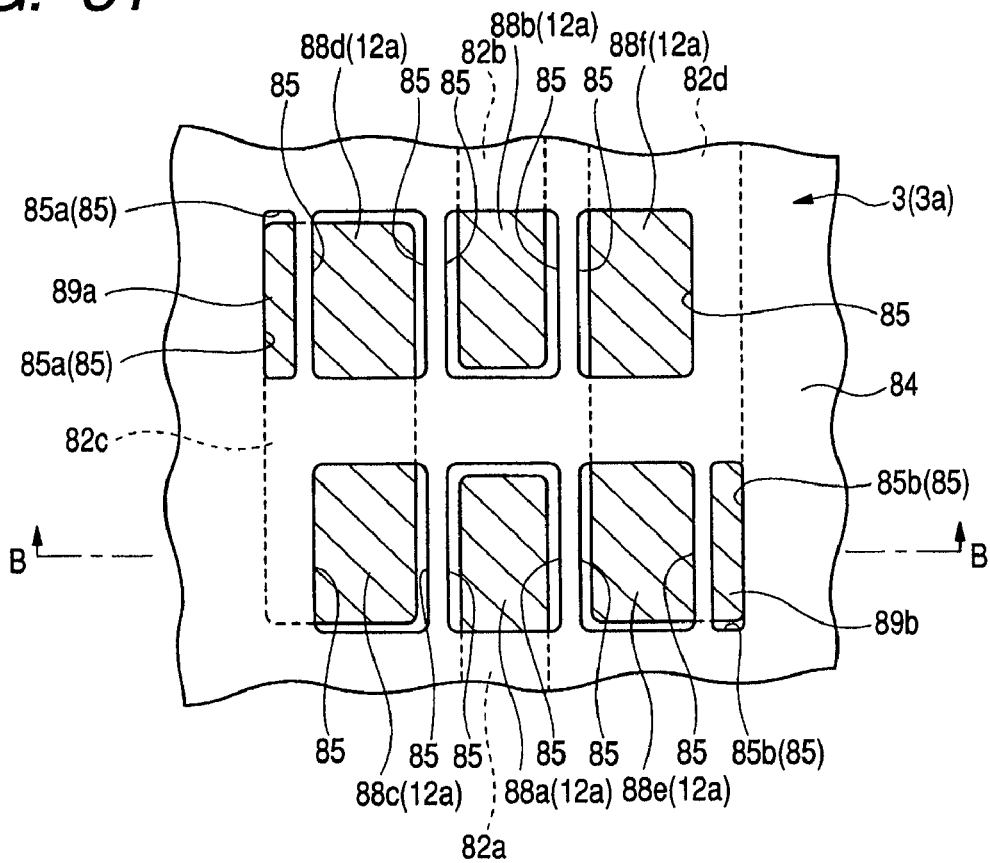
FIG. 31 is a main top view of the wiring board before mounting the integrated passive component.

FIG. 28 is a plan view (top view) of a main part of the RF power module 1 of the embodiment, and showing a region in the vicinity of the integrated passive component 6. Note that FIG. 28 shows a state in which the RF power module is seen through the seal resin 7. FIG. 29 is a plan view of the integrated passive component 6, and showing a front surface 19*a* of the component which is a main surface opposed to the upper surface 3*a* of the wiring board 3 when it is mounted over the wiring board 3. FIGS. 30 and 31 are top views of the main part (plan views of the main part) of the wiring board 3 before the integrated passive component 6 is mounted, and showing the region corresponding to FIG. 28. FIG. 30 represents the positions of the via holes 13 by omitting an overcoat glass layer 84 and a plating layer 86 from FIG. 31.

Note that FIG. 28 is a plan view in which hatching is given to the patterns for position identification 89*a* and 89*b* for easy viewing. FIG. 30 is a plan view in which hatching is given to a conductive pattern 82 for easy viewing. FIG. 31 is a plan view in which hatching is given to terminals 88*c*, 88*d*, 88*e*, 88*f*, and the patterns for position identification 89*a* and 89*b* for easy viewing.

Figure 32:
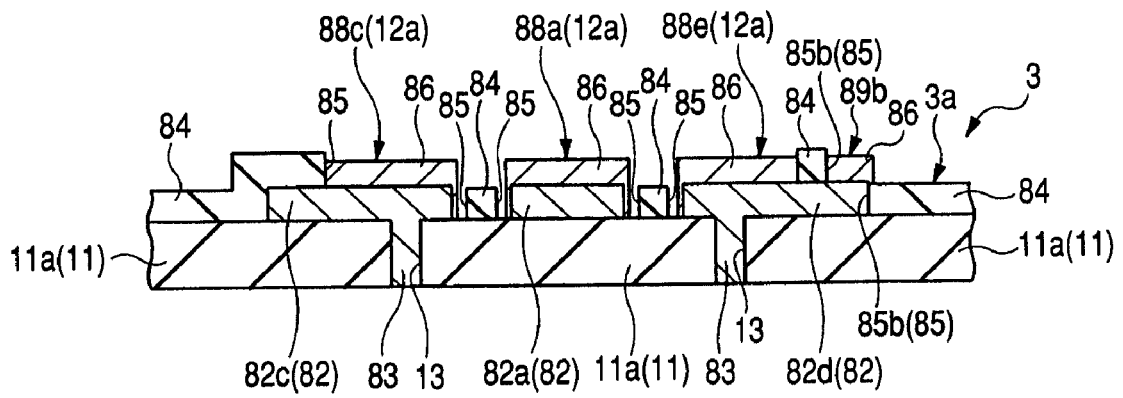
FIG. 32 is a sectional view of a main part of the wiring board before mounting the integrated passive component.
Figure 33:
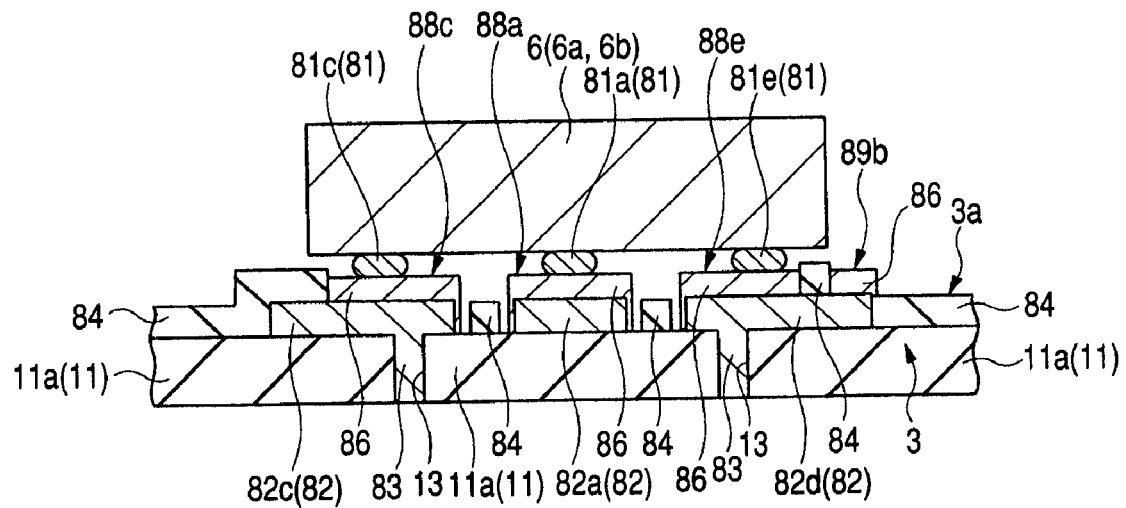
FIG. 33 is a sectional view showing a main part of a state in which the integrated passive component is mounted over the upper surface of the wiring board.

FIG. 32 is a sectional view of a main part of the wiring board 3 before the integrated passive component 6 is mounted, and approximately corresponds to a section taken along a line B-B of FIG. 31. FIG. 33 is a sectional view of a main part showing a state in which the integrated passive component 6 is mounted over the upper surface 3*a* of the wiring board 3 (that is, a sectional view of a main part of the RF power module 1, while omitting the representation of the seal resin part 6), and approximately corresponds to a section taken along a line B-B of FIG. 28. Note that the wiring board 3 is a multilayer substrate composed of an integral lamination including the plurality of insulating layers 11, the wiring layers located between the insulating layers 11, and the wiring layers disposed as the uppermost and lowermost layers of the substrate. The sectional views of FIGS. 32 and 33 show an upper part from the uppermost insulating layer 11*a* among the plurality of insulating layers 11, while omitting the representation of the lower part from the insulating layer 11*a*.

As shown in FIG. 29, the integrated passive component 6 includes six terminals (electrodes) 81. The terminal 81 corresponds to the above-mentioned bump electrode 18 (bump electrode 64). The six terminals 81 of the integrated passive component 6 are comprised of an input terminal 81*a*, an output terminal 81*b*, and four ground terminals 81*c*, 81*d*, 81*e*, 81*f*. The input terminal 81*a* corresponds to the input terminal 116 of FIG. 2, while the output terminal 81*b* corresponds to the output terminal 117 of FIG. 2. Each of the ground terminals 81*c*, 81*d*, 81*e*, and 81*f* corresponds to either the ground terminal 118 or the ground terminal 119 of FIG. 2. Although in order to strengthen the ground, the four ground terminals 81*c*, 81*d*, 81*e*, and 81*f* are provided in the integrated passive component 6, in another embodiment two ground terminals corresponding to the ground terminals 118 and 119 of FIG. 2 can be provided in the integrated passive component 6. In this case, the integrated passive component 6 has four terminals 81 respectively corresponding to the input terminal 116, the output terminal 117, and the ground terminals 118 and 119 of FIG. 2.

As shown in FIGS. 30 and 32, the conductive pattern 82 mainly consisting of, for example, copper (Cu), is formed on the upper surface of the insulating layer 11*a* in the wiring board 3. The conductive pattern 82 corresponds to the above-mentioned conductive pattern 12*b*. The conductive pattern 82 is electrically connected to the wiring layer, which is a lower layer from the insulating layer 11*a*, via a conductor 83 within the via hole 13 formed in the insulating layer 11*a* if necessary. The conductor 83 within the via hole 13 is made of the same kind of conductor as that of the conductive pattern 82.

Referring to FIG. 32, an overcoat glass layer (insulating layer) 84 is formed on the upper surface of the insulating layer 11*a* over the wiring board 3 to cover the conductive pattern 82. Note that in the entire plan view of FIG. 9, the overcoat glass layer 84 is not shown.

The overcoat glass layer 84 is patterned so as to be exposed at parts thereof for providing the substrate side terminals 12*a* to be connected to the component mounted over the wiring board 3 (the semiconductor chips 2, 4, the passive component 5, and the integrated passive component 6), as well as at parts for forming the patterns for position identification 89*a* and 89*b*. Also, the overcoat glass layer 84 is patterned so as to cover the remaining other conductive patterns 82. That is, the overcoat glass layer 84 has openings 85, from which the conductive patterns 82 serving as the substrate side terminals 12*a* and the conductive patterns 82 serving as the patterns for position identification 89a and 89b are exposed. Thus, by covering the conductive patterns 82 with the overcoat glass layer 84, the conductive patterns 82 other than the substrate side terminals 12a and the patterns for position identification 89a and 89b can be protected and insulated.

A part of the conductive pattern 82 exposed from the opening 85 of the overcoat glass layer 84 has a plating layer 86 formed on the upper surface (front surface) thereof. The plating layer 86 is composed of a laminated film of a lower layer side nickel (Ni) plating layer, and a gold (Au) plating layer disposed thereon. The plating layer 86 is formed not on the overcoat glass layer 84, but on the conductive pattern 82 exposed from the opening 85 of the overcoat glass layer 84. The plating layer 86 is formed on the conductive pattern 82 to form the substrate side terminal 12a which is capable of being subjected to the solder connection, the wire bonding, or the like.

Referring back to FIG. 30, there are provided, on the upper surface 3a of the wiring board 3, an electrode pattern 82a for input signals to be connected to the input terminal 81a of the integrated passive component 6, an electrode pattern 82b for output signals to be connected to the output terminal 81b of the integrated passive component 6, an electrode pattern 82c for ground to be connected to the ground terminals 81c and 81d of the integrated passive component 6, and an electrode pattern 82d for ground to be connected to the ground terminals 81e and 81f of the integrated passive component 6. The electrode pattern 82a for input signals, the electrode pattern 82b for output signals, and the electrode patterns 82c and 82d for ground are formed by the conductive patterns 82 in the vicinity of the position where the integrated passive component 6 is to be mounted over the upper surface 3a of the wiring board 3.

As shown in FIGS. 31 and 32, the electrode pattern 82a for input signals has a region opposed to the input terminal 81a of the integrated passive component 6 in mounting of the component 6 (a region near the tip end on the side opposed to the electrode pattern 82b for output signals). The region of the pattern 82 is exposed from the opening 85 of the overcoat glass layer 84 to serve as a terminal 88a with the plating layer 86 formed on its surface. The electrode pattern 82b for output signals has a region opposed to the output terminal 81b of the integrated passive component 6 in mounting of the component 6 (a region near the tip end on the side opposed to the electrode pattern 82a for input signals). The region of the pattern 82b is exposed from the opening 85 of the overcoat glass layer 84 to serve as a terminal 88b with the plating layer 86 formed on its surface. The electrode pattern 82c for ground has regions opposed to the ground terminals 81c an 81d of the integrated passive component 6 in mounting of the component 6. These regions are exposed from the openings 85 of the overcoat glass layer 84 to serve as the terminals 88c and 88d with the plating layer 86 formed on surfaces thereof. The electrode pattern 82d for ground has regions opposed to the ground terminals 81e an 81f of the integrated passive component 6 in mounting of the component 6. These regions are exposed from the openings 85 of the overcoat glass layer 84 to serve as the terminals 88e and 88f with the plating layers 86 formed on surfaces thereof. These terminals 88a to 88f correspond to some of the substrate side terminals 12a which are to be connected to the terminals 81 (bump electrodes 18) of the integrated passive component 6.

Furthermore, in the embodiment, as shown in FIGS. 31 and 32, a part of the electrode pattern 82c for ground is extended from the opening 85a of the overcoat glass layer 84 to form the pattern 89a for position identification with the plating layer 86 formed on its surface. Similarly, a part of the electrode pattern 82d for ground is extended from the opening 85b of the overcoat glass layer 84 to form the pattern 89b for position identification with the plating layer 86 formed on its surface.

As can be seen from FIGS. 28 to 33, in mounting the integrated passive component 6 over the upper surface 3a of the wiring board 3, the input terminal 81a of the integrated passive component 6 is connected (electrically connected) to the terminal 88a of the wiring board 3, the output terminal 81b of the component 6 is connected (electrically connected) to the terminal 88b of the wiring board 3, and the ground terminals 81c, 81d, 81e, and 81f of the component 6 are connected (electrically connected) to the terminals 88c, 88d, 88e, and 88f of the wiring board 3, respectively.

When the terminal 81 of the integrated passive component 6 is made of a solder bump or the like, or when solder is supplied onto the terminals 88a, 88b, 88c, 88d, 88e, and 88f of the wiring board 3 to mount the integrated passive component 6 over the wiring board 3, the input terminal 81a, the output terminal 81b, and the grounds 81c, 81d, 81e, 81f of the integrated passive component 6 can be connected (solder-connected) to the terminals 88a, 88b, 88c, 88d, 88e, and 88f of the wiring board 3, respectively, through the solder by a solder reflow process after mounting the component 6. Moreover, when the terminal 81 of the integrated passive component 6 is formed of a gold bump or the like, the input terminal 81a, the output terminal 81b, and the grounds 81c, 81d, 81e, 81f of the integrated passive component 6 can be connected to the terminals 88a, 88b, 88c, 88d, 88e, and 88f of the wiring board 3, respectively, by pressure bonding or thermocompression bonding.

The patterns for position identification 89a and 89b are patterns for identifying (confirming) the position (mounting position) of the integrated passive component 6 (integrated passive element) after mounting the integrated passive component 6 over the upper surface 3a of the wiring board 3 (after semiconductor reflow process) (that is, after a step of FIG. 21) before forming the seal resin 7 (before a step of FIG. 23). Thus, the patterns for position identification 89a and 89b are patterns identifiable by eyes or by an image device or the like. The terminal 81 of the integrated passive component 6 is not connected to the patterns for position identification 89a and 89b over the upper surface 3a of the wiring board 3.

As shown in FIGS. 28 and 33, in a state where the integrated passive component 6 is mounted over the upper surface 3a of the wiring board 3, the patterns for position identification 89a and 89b for identifying the position of the integrated passive component 6 are provided at least in a part around the component 6 over the upper surface 3a of the wiring board 3, and the integrated passive component 6 does not exist directly above at least one part of each of the patterns for position identification 89a and 89b. Thus, when viewing (observing) the upper surface 3a of the wiring board 3 from the above after mounting the integrated passive component 6 over the upper surface 3a of the wiring board 3 (after the solder reflow process) before forming the seal resin 7, the existence of the patterns for position identification 89a and 89b can be identified (confirmed, or observed) around the integrated passive component 6 as shown in FIG. 28. If the integrated passive component 6 is located at the position where it should be originally mounted, the patterns for position identification 89a and 89b are provided in such positions that both patterns for position identification 89a and 89b can be identified (confirmed, or observed) around (on both sides of) the integrated passive component 6 when viewing (observing) the upper surface 3a of the wiring board 3 from the above.

Figure 34:
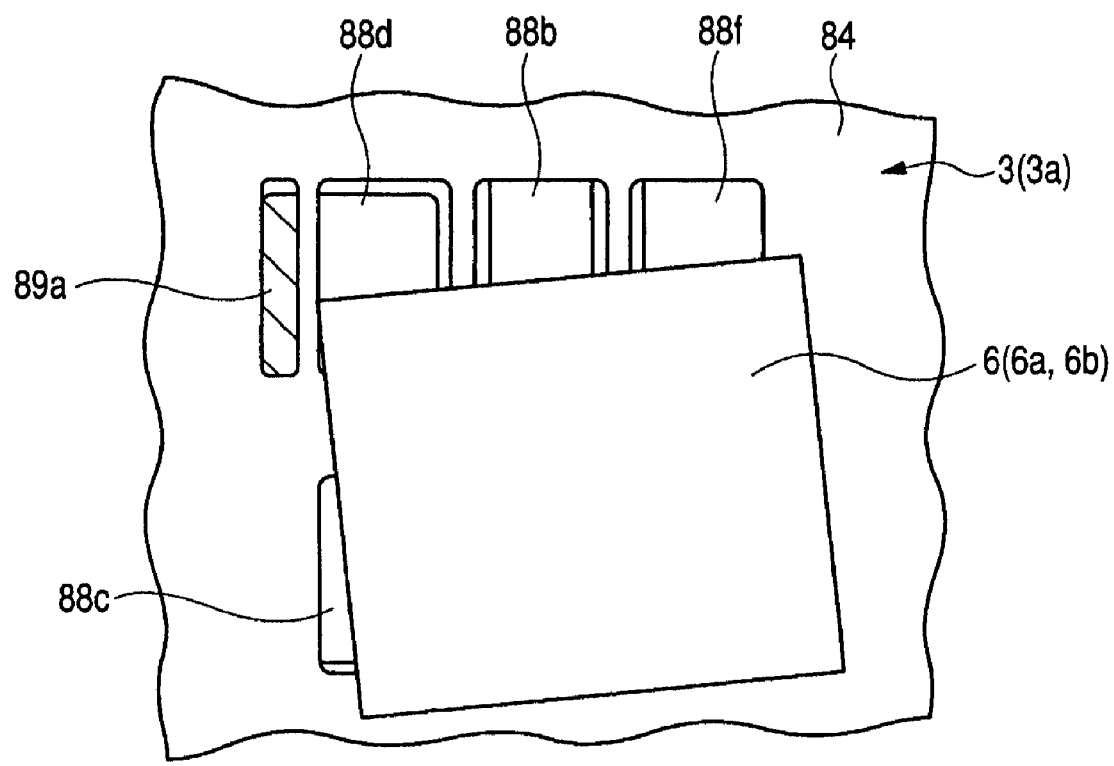
FIG. 34 is a main plan view showing a main part of a case where the position of the integrated passive component deviates from a predetermined position.

FIG. 34 is a plan view showing a main part of a case where the position of the integrated passive component 6 deviates from the position where it should be originally mounted at a stage in which the integrated passive component 6 is mounted over the wiring board 3 (in the state after the solder reflow process). FIG. 34 corresponds to the above-mentioned FIG. 28.

As shown in FIG. 34, if the position of the integrated passive component 6 deviates from the position where it should be originally mounted, at least one of the patterns for position identification 89a and 89b is hidden by the integrated passive component 6.

When viewing (observing) the upper surface 3a of the wiring board 3 from the above, even if one of the patterns for position identification 89a and 89b can be identified around the integrated passive component 6, both of the patterns for position identification 89a and 89b cannot be identified.

In contrast, if the integrated passive component 6 is located at the position where it should be originally mounted, as shown in FIG. 28, both the patterns for position identification 89a and 89b can be identified (confirmed, or observed) around the integrated passive component 6 (on both sides in this case) when viewing (observing) the upper surface 3a of the wiring board 3 from the above as shown in FIG. 28.

Thus, at the stage where the integrated passive component 6 is mounted over the wiring board 3 (in the state after the solder reflow process), it can be confirmed or determined whether or not the position of the integrated passive component 6 deviates from the position where it should be originally mounted by the patterns for position identification 89a and 89b. Therefore, after the mounting step of the integrated passive component (the stage of the step of FIG. 21), and before a forming step of the seal resin 7 (the stage of the step of FIG. 23), an inspection step is introduced in which a mounting state of the integrated passive component 6 in the wiring board 4 is confirmed and selected based on the patterns for position identification 89a and 89b. Only the integrated passive component 6 mounted in the position where it should be originally mounted as illustrated in FIG. 28, can be fed to a next step (for example, a wire bonding step, or the forming step of the seal resin This can improve the reliability of mounting of the integrated passive component 6, and further the reliability of the RF power module 1.

The integrated passive component 6 which is not mounted in the position where it should be originally mounted as shown in FIG. 34 is removed as a defective piece, or is re-mounted again.

Thus, in the RF power module 1 finally manufactured, the integrated passive component 6 is mounted at the position where it should be mounted as shown in FIG. 28. The patterns for position identification 89a and 89b are formed at least in the part around the integrated passive component 6 over the upper surface 3a of the wiring board 3, and no integrated passive component exists directly above at least one part of each of the patterns for position identification 89a and 89b. That is, when viewing the wiring board 3 on which the integrated passive component 6 is mounted from the above (note that the seal resin 7 is seen through or removed), both the patterns for position identification 89a and 89b are formed (arranged) at least in the part around the integrated passive component 6 (on both sides of the component 6 in this case), and the integrated passive component 6 does not exist directly above at least one part of each of the patterns for position identification 89a and 89b.

In the embodiment, the patterns for position identification 89a and 89b are formed by the same conductive layer (by the conductive patterns 82 and the plating layer 86 thereon in this case) as the plurality of terminals 88a, 88b, 88c, 88d, 88e, and 88f over the upper surface 3a of the wiring board 3 electrically connected to the plurality of terminals 81a, 81b, 81c, 81d, 81e, and 81f (third electrodes) of the integrated passive component 6 (integrated passive element) Thus, the patterns for position identification 89a and 89b can be formed in the same step of forming the terminals 88a, 88b, 88c, 88d, 88e, and 88f, thereby avoiding increase in the number of manufacturing steps and in manufacturing cost of the wiring board 3 due to provision of the patterns for position identification 89a and 89b in the wiring board 3.

While the invention developed by the present inventors has been described specifically based on various embodiments, the present invention is not limited to the embodiments as specifically described herein. It is needless to say that various modifications can be made to the embodiments without departing from the scope of the invention.

What is claimed is:

1. An electronic device including a power amplifier circuit and a switch circuit to which an output of the power amplifier circuit is connected, the electronic device comprising:
    a wiring board;
    a first semiconductor chip mounted over a main surface of the wiring board, the first semiconductor chip including a MISFET (Metal Insulator Semiconductor Field Effect Transistor) formed therein for constituting the power amplifier circuit; and
    a second semiconductor chip mounted over the main surface of the wiring board for constituting the switch circuit,
    wherein low pass filter circuits of the first and second systems are formed of first and second integrated passive elements mounted over the main surface of the wiring board, respectively,
    wherein the electronic device comprises the power amplifier circuits of first and second systems, the switch circuits of the first and second systems electrically connected to the outputs of the power amplifier circuits of the first and second systems, respectively, and the low pass filter circuits of the first and second systems electrically connected between the power amplifier circuits of the first and second systems and the switch circuits of the first and second systems, respectively,
    wherein the MISFETs constituting the power amplifier circuits of the first and second systems are formed in the first semiconductor chip,
    wherein the switch circuits of the first and second systems are formed in the second semiconductor chip, and
    wherein electrical connections are established between the first integrated passive element and the second semiconductor chip, and between the second integrated passive element and the second semiconductor chip over the main surface of the wiring board via the conductive pattern of the wiring board or via the conductive pattern and the bonding wire without via the passive component.

2. The electronic device according to claim 1, wherein the first semiconductor chip further includes a control circuit for the switch circuit.

3. The electronic device according to claim 1, wherein the second semiconductor chip includes a HEMT (High Electron Mobility Transistor) or a diode formed therein for constituting the switch circuit.

4. The electronic device according to claim 1, wherein the electronic device is mounted over a mobile communication device.

5. The electronic device according to claim 4, wherein the switch circuit is a switch circuit serving as an antenna switch circuit for the mobile communication device.

6. The electronic device according to claim 1,
wherein a transmission frequency band of the power amplifier circuit of the first system is the 0.9 GHz band, and
wherein a transmission frequency band of the power amplifier circuit of the second system is the 1.8 GHz band.

7. The electronic device according to claim 1,
wherein the second semiconductor chip is disposed between the first integrated passive element and the second integrated passive element over the main surface of the wiring board.

8. The electronic device according to claim 1,
wherein the second semiconductor chip is disposed next to the first semiconductor chip over the main surface of the wiring board.

9. The electronic device according to claim 8, wherein the first semiconductor chip further comprises a control circuit for the switch circuit,
wherein the first semiconductor chip and the second semiconductor chip are electrically connected to each other via a conductive pattern of the wiring board or via the conductive pattern and a bonding wire over the main surface of the wiring board, and
wherein a control signal of the switch circuit is supplied from the first semiconductor chip to the second semiconductor chip.

10. An electronic device including a power amplifier circuit and a switch circuit to which an output of the power amplifier circuit is connected, the electronic device comprising:
a wiring board;
a first semiconductor chip mounted over a main surface of the wiring board, the first semiconductor chip including a MISFET (Metal Insulator Semiconductor Field Effect Transistor) formed therein for constituting the power amplifier circuit; and
a second semiconductor chip mounted over the main surface of the wiring board for constituting the switch circuit,
wherein low pass filter circuits of the first and second systems are formed of first and second integrated passive elements mounted over the main surface of the wiring board, respectively,
wherein the electronic device comprises the power amplifier circuits of first and second systems, the switch circuits of the first and second systems electrically connected to the outputs of the power amplifier circuits of the first and second systems, respectively, and the low pass filter circuits of the first and second systems electrically connected between the power amplifier circuits of the first and second systems and the switch circuits of the first and second systems, respectively,
wherein the MISFETs constituting the power amplifier circuits of the first and second systems are formed in the first semiconductor chip,
wherein the switch circuits of the first and second systems are formed in the second semiconductor chip, and
wherein a plurality of first electrodes of the first semiconductor chip and a plurality of second electrodes of the wiring board are electrically connected to each other via a plurality of bonding wires over the main surface of the wiring board, and
wherein each of the plurality of bonding wires is prevented from passing through and on another second electrode having a potential different from that of the second electrode connected.

11. The electronic device according to claim 10, wherein the plurality of second electrodes are arranged in line around the first semiconductor chip over the main surface of the wiring board.

12. The electronic device according to claim 11, wherein the first semiconductor chip further includes a control circuit for the switch circuit formed therein.

13. An electronic device including a power amplifier circuit and a low pass filter circuit electrically connected to the power amplifier circuit, the electronic device comprising:
a wiring board;
a first semiconductor chip mounted over a main surface of the wiring board for constituting the power amplifier circuit; and
an integrated passive element mounted over the main surface of the wiring board for constituting the low pass filter circuit,
wherein a pattern for identifying a position of the integrated passive element is formed over the main surface of the wiring board, and
wherein the pattern for identifying the position of the integrated passive element is formed of the same conductive layer as that of a plurality of first electrodes disposed over the main surface of the wiring board and electrically connected to a plurality of second electrodes of the integrated passive element.

14. An electronic device including a power amplifier circuit and a low pass filter circuit electrically connected to the power amplifier circuit, the electronic device comprising:
a wiring board;
a first semiconductor chip mounted over a main surface of the wiring board for constituting the power amplifier circuit; and
an integrated passive element mounted over the main surface of the wiring board for constituting the low pass filter circuit,
wherein a pattern for identifying a position of the integrated passive element is formed over the main surface of the wiring board,
wherein the pattern for identifying the position of the integrated passive element is provided at least in a part around the integrated passive element over the main surface of the wiring board, and
wherein the integrated passive element does not exist directly above at least one part of the pattern for identifying the position of the integrated passive element.

* * * * *